United States Patent
Park et al.

(10) Patent No.: US 11,637,192 B2
(45) Date of Patent: Apr. 25, 2023

(54) METAL OXIDE SEMICONDUCTOR-CONTROLLED THYRISTOR DEVICE HAVING UNIFORM TURN-OFF CHARACTERISTIC AND METHOD OF MANUFACTURING THE SAME

(71) Applicant: Electronics and Telecommunications Research Institute, Daejeon (KR)

(72) Inventors: Kun Sik Park, Daejeon (KR); Jong Il Won, Daejeon (KR); Doo Hyung Cho, Daejeon (KR); Hyun Gyu Jang, Daejeon (KR); Dong Yun Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 3 days.

(21) Appl. No.: 17/355,977

(22) Filed: Jun. 23, 2021

(65) Prior Publication Data
US 2021/0408265 A1 Dec. 30, 2021

(30) Foreign Application Priority Data
Jun. 24, 2020 (KR) .................. 10-2020-0077396
Jun. 17, 2021 (KR) .................. 10-2021-0078878

(51) Int. Cl.
*H01L 29/749* (2006.01)
*H01L 29/745* (2006.01)
*H01L 29/66* (2006.01)

(52) U.S. Cl.
CPC ...... *H01L 29/66378* (2013.01); *H01L 29/749* (2013.01); *H01L 29/7455* (2013.01)

(58) Field of Classification Search
CPC ....... H01L 29/749; H01L 29/87; H01L 29/74; H01L 29/66363
See application file for complete search history.

(56) References Cited

U.S. PATENT DOCUMENTS

| 4,816,892 A | 3/1989 | Temple |
| 5,260,590 A | 11/1993 | Temple |
| 8,741,699 B2 | 6/2014 | Arai et al. |
| 9,166,017 B2 | 10/2015 | Arai et al. |

(Continued)

FOREIGN PATENT DOCUMENTS

| CN | 111739930 A | * | 10/2020 | ......... H01L 29/0619 |
| CN | 112382568 A | * | 2/2021 | |

(Continued)

OTHER PUBLICATIONS

Chen Wan-Jun et al., High dV/dt immunity MOS controlled thyristor using a double variable lateral doping technique for capacitor discharge applications, Chin. Phys. B, vol. 23, No. 7, 2014, Chinese Physical Society and IOP Publishing Ltd.

(Continued)

*Primary Examiner* — Xiaoming Liu
(74) *Attorney, Agent, or Firm* — William Park & Associates Ltd.

(57) ABSTRACT

The present invention forms an off-FET channel having a uniform and short length by using a self-align process of a method of forming and recessing a spacer, thereby enhancing the current driving capability of an off-FET and the uniformity of a device operation.

9 Claims, 19 Drawing Sheets

112 : on-FET channel region
110 : off-FET channel region

(56) References Cited

U.S. PATENT DOCUMENTS

2004/0214382 A1  10/2004  Park et al.
2006/0125041 A1  6/2006  Yang et al.

FOREIGN PATENT DOCUMENTS

| JP | H0793425 B2 | 10/1995 |
| JP | 3122119 B2 | 1/2001 |
| JP | 5816570 B2 | 11/2015 |

OTHER PUBLICATIONS

H. Detter et al., New (Super) Self Aligned MOS Controlled Thyristors, (S)SAMCTs, switching 20 A at 4 kV, IEDM, Proceedings of 1994 IEEE International Electron Devices Meeting, p. 395-398, Dec. 11-14, 1994.
S. D. Arthur et al., Special 1400 Volt N-MCT Designed for Surge Applications, Harris Power Research & Development, USA, The European Power Electronics Association, pp. 266-271, 1993.
Victor A. K. Temple et al., MOS-Controlled Thyristors—A New Class of Power Devices, IEEE, Trans. Electron Devices, vol. ED-33, No. 10. p. 1609-1618, Oct. 1986.

* cited by examiner

112 : on-FET channel

112 : on-FET channel

112 : on-FET channel region
110 : off-FET channel region

112 : on-FET channel region
110 : off-FET channel region

112 : on-FET channel region
110 : off-FET channel

112 : on-FET channel region
110 : off-FET channel region

METAL OXIDE SEMICONDUCTOR-CONTROLLED THYRISTOR DEVICE HAVING UNIFORM TURN-OFF CHARACTERISTIC AND METHOD OF MANUFACTURING THE SAME

CROSS-REFERENCE TO RELATED APPLICATIONS

This application claims priority under 35 U.S.C. § 119 to Korean Patent Application No. 10-2020-0077396, filed on Jun. 24, 2020 and Korean Patent Application No. 10-2021-0078878, filed on Jun. 17, 2021, the disclosure of which is incorporated herein by reference in its entirety.

TECHNICAL FIELD

The present invention relates to a power semiconductor device, and more particularly, to technology for a metal oxide semiconductor (MOS)-controlled thyristor (MCT) device.

BACKGROUND

A metal oxide semiconductor (MOS)-controlled thyristor (MCT) is a device which is implemented by integrating a MOS gate into a thyristor having a PNPN junction structure and controls the turn-on and turn-off of the thyristor by using a gate voltage.

The MCT has better electrical characteristics such as current driving capability and low on-state voltage loss than other power semiconductor devices such as a metal-oxide-semiconductor field-effect transistor (FET) (MOSFET), a bipolar junction transistors (BJT), and an insulated-gated bipolar transistor (IGBT).

Moreover, because the turn-on/off driving of the MCT is performed by applying a voltage to a MOS gate having a high impedance, the MCT has power loss and switching loss, which are far less than a gate turn-off thyristor which performs turn-on/off driving with a conventional current, and is easy to implement a driving circuit.

Moreover, the MCT has better timing accuracy than a spark gap which is used as a switch in a pulse power system such as a high-energy explosive device and an electromagnetic force propulsion device, is not limited in pulse-life as well as simple triggering, has excellent stability and durability, and is lightweight, small in size, and low in cost.

The MCT maintains a turn-on state even when a gate power is cut off by a regenerative operation of each of a PNP BJT and an NPN BJT of a thyristor in a turn-on state, and thus, a current driving capability of a device is determined based on the turn-off performance thereof.

In an MCT device, an MOS gate is integrated into a PNPN thyristor structure, a thyristor is turned on based on the turn-on of an on-FET, the thyristor is turned off based on the turn-on of an off-FET, and a current driving capability of the MCT device is determined based on the turn-off performance thereof, whereby an off FET having a short channel length should be formed.

Moreover, in a turn-off process, an off-FET in the MCT device should have a uniform characteristic so as to prevent device damage. To this end, it is required to form an off-FET having a uniform channel length.

Moreover, in manufacturing the MCT device, a high concentration of an upper base (a p-base (p-type base) in an n-MCT (n-type MCT)) and a high concentration of an upper emitter (an n-emitter in an n-MCT) are required for realizing an emitter injection characteristic and a breakdown voltage characteristic of a thyristor.

However, based on a high concentration of the p-base and the n-emitter, a threshold voltage (Vth) of an on-FET may have a positive (+) value and a threshold voltage (Vth) of an off-FET may greatly move in a negative (−) direction, and due to this, the turn-off performance of the MCT may be reduced and a gate driving circuit may be complicated.

SUMMARY

Accordingly, the present invention provides an MCT device, including an off-FET formed to have a uniform and short length so as to enhance current driving capability and the uniformity and turn-off performance of a device operation, and a method of manufacturing the MCT device. Also, the present invention provides an MCT device, which is turned off based on a low gate voltage and a gate voltage of 0 V, and a method of manufacturing the MCT device.

In one general aspect, a method of manufacturing a metal oxide semiconductor (MOS)-controlled thyristor (MCT) device includes: forming a first conductive type base region doped with first conductive type impurities and a second conductive type emitter region doped with second conductive type impurities in the first conductive type base region, in a substrate; forming a spacer on a side surface of an oxide layer which is formed on the substrate and upward exposes the second conductive type emitter region; ion-implanting the first conductive type impurities into the second conductive type emitter region upward exposed by the spacer to form a first conductive type drain region of an off-field effect transistor (TFT) and to form a channel region of the off-FET defined between a junction surface of the second conductive type emitter region and a junction surface of the first conductive type drain region; ion-implanting the first conductive type impurities into the upward exposed channel region of the off-FET by removing the spacer; removing the oxide layer and forming a gate electrode layer, upward exposing the first conductive type drain region and the second conductive type emitter region, on the substrate; ion-implanting the second conductive type impurities into the second conductive type emitter region upward exposed by the gate electrode layer to form a second conductive type doping region; and forming an upper metal layer, used as a cathode electrode, on the gate electrode layer, the first conductive type drain region, and the second conductive type doping region and a lower metal layer, used as an anode electrode, on a bottom surface of the substrate.

In an embodiment of the method of manufacturing the MCT device, the forming of the channel region of the off-FET may include performing an ion implantation process of ion-implanting the first conductive type impurities into the second conductive type emitter region upward exposed by the spacer and a photoresist pattern formed on the second conductive type emitter region upward exposed by the spacer by using the spacer and the photoresist pattern as an ion implantation mask.

In an embodiment of the method of manufacturing the MCT device, the channel region of the off-FET may be formed in a lateral direction between the junction surface of the second conductive type emitter region and the junction surface of the first conductive type drain region, under the spacer.

In an embodiment of the method of manufacturing the MCT device, the ion-implanting of the first conductive type impurities into the channel region of the off-FET may include: removing the spacer by using an isotropic etching process; and ion-implanting the first conductive type impurities into the channel region of the off-FET upward exposed by the isotropic etching process to adjust a turn-on voltage of the off-FET.

In an embodiment of the method of manufacturing the MCT device, the first conductive type impurities ion-implanted into the channel region of the off-FET may be first conductive type impurities, and an ion dose of the first conductive type impurities may be about $1\times10^{11}$ cm$^{-2}$ or about $1\times10^{13}$ cm$^{-2}$.

In an embodiment of the method of manufacturing the MCT device, the ion-implanting of the first conductive type impurities into the channel region of the off-FET may include: further removing the spacer and the oxide layer by using an etching process; forming another oxide layer on a surface of the substrate upward exposed by removing the spacer and the oxide layer; forming another photoresist pattern on the other oxide layer and between the first conductive type base region and another first conductive type base region adjacent to the first conductive type base region; and performing an ion implantation process of ion-implanting the first conductive type impurities into the channel region of the off-FET and a channel region of an on-FET adjacent to the channel region of the off-FET by using the other photoresist pattern as an ion implantation mask.

In an embodiment of the method of manufacturing the MCT device, the channel region of the off-FET may be a region under a surface of the first conductive type base region.

In an embodiment of the method of manufacturing the MCT device, the ion-implanting of the first conductive type impurities into the channel region of the off-FET may include: further removing the oxide layer and the spacer by using an etching process; forming another oxide layer on a whole surface of the substrate upward exposed by removing the oxide layer and the spacer; and ion-implanting the first conductive type impurities into the channel region of the off-FET and a channel region of an on-FET adjacent to the channel region of the off-FET to form a threshold voltage adjustment layer on the whole surface of the substrate.

In an embodiment of the method of manufacturing the MCT device, when the first conductive type impurities are p-type impurities, the second conductive type impurities may be n-type impurities, and when the first conductive type impurities are n-type impurities, the second conductive type impurities may be p-type impurities.

In another general aspect, an metal oxide semiconductor (MOS)-controlled thyristor (MCT) device includes: a substrate including a first conductive type emitter layer doped with first conductive type impurities and a second conductive type base layer doped with the second conductive type impurities disposed on the first conductive type emitter layer; a first conductive type base region disposed in the second conductive type base layer; a second conductive type emitter region disposed in the first conductive type base region; a second conductive type doping region disposed in the second conductive type emitter region and a first conductive type drain region of an off-field effect transistor (TFT) surrounding the second conductive type doping region; a channel region of an off-FET doped with the first conductive type impurities and disposed between a junction surface of the first conductive type drain region and a junction surface of the second conductive type emitter region, in the second conductive type emitter region; a channel region of an on-FET disposed between the junction surface of the second conductive type emitter region and a junction surface of the first conductive type base region to be adjacent to the channel region of the off-FET, in the first conductive type base region; a gate electrode layer disposed on a whole surface of the substrate, the gate electrode layer including an opening portion upward exposing the second conductive type doping region and the first conductive type drain region; a cathode electrode layer disposed on the first conductive type drain region and the second conductive type doping region, upward exposed by the gate electrode layer and the opening portion, with an interlayer insulation layer therebetween; and an anode electrode layer disposed on a bottom surface of the substrate.

In an embodiment of the MCT device, the first conductive type impurities may be doped on all or a portion of each of the channel region of the off-FET and the channel region of the on-FET, for enhancing an electrical characteristic of each of the off-FET and the on-FET.

In an embodiment of the MCT device, the channel region of the off-FET may be an oxide layer formed on the second conductive type base layer and may be formed by a self-align process using a spacer formed on a side surface of the oxide layer and a photoresist pattern formed on the second conductive type emitter region.

In an embodiment of the MCT device, when the substrate is seen from above, the second conductive type doping region, the first conductive type drain region, the channel region of the off-FET, and the channel region of the on-FET may extend in a line shape, and when the substrate is seen from above, the opening portion of the gate electrode layer may have a line shape to upward expose a portion of each of the first conductive type drain region and the second conductive type doping region extending in a line shape.

In an embodiment of the MCT device, when the substrate is seen from above, the first conductive type emitter region may have a circular shape, the channel region of the off-FET having the first conductive type may have a circular band shape at an end portion of the second conductive type emitter region, the second conductive type doping region may be apart from the channel region of the on-FET with the channel region of the off-FET therebetween, and the second conductive type base region exposed at the surface of the substrate may be apart from the channel region of the off-FET by a certain distance with the channel region of the on-FET therebetween, and when the substrate is seen from above, the opening portion of the gate electrode layer may have a circular shape upward exposing a portion of each of the second conductive type doping region and the first conductive type drain region.

In an embodiment of the MCT device, when the substrate is seen from above, the second conductive type base layer exposed at the surface of the substrate may have a circular shape, the channel region of the on-FET exposed at the surface of the substrate may have a circular band shape surrounding the second conductive type base layer exposed at the surface of the substrate, the channel region of the off-FET may have a circular band shape surrounding the channel region of the on-FET, and the first conductive type drain region may surround the channel region of the off-FET, and when the substrate is seen from above, the opening portion of the gate electrode layer upward may expose a portion of each of the second conductive type doping region and the first conductive type drain region.

In an embodiment of the MCT device, when the substrate is seen from above, the second conductive type emitter region may have an octagonal shape, the channel region of the off-FET having the first conductive type may have an octagonal band shape at an end portion of the second conductive type emitter region, the second conductive type doping region may be apart from the channel region of the on-FET with the channel region of the off-FET therebetween, and the second conductive type base region exposed at the surface of the substrate may be apart from the channel region of the off-FET by a certain distance with the channel region of the on-FET therebetween, and when the substrate is seen from above, the opening portion of the gate electrode layer upward may expose a portion of each of the second conductive type doping region and the first conductive type drain region.

In an embodiment of the MCT device, the second conductive type base region exposed at the surface of the substrate may have a circular shape, and the second conductive type emitter region having an octagonal shape and the channel region of the off-FET having an octagonal shape may each include a concave side at a portion adjacent to the second conductive type base region.

Other features and aspects will be apparent from the following detailed description, the drawings, and the claims.

DETAILED DESCRIPTION OF EMBODIMENTS

Figure 1A:
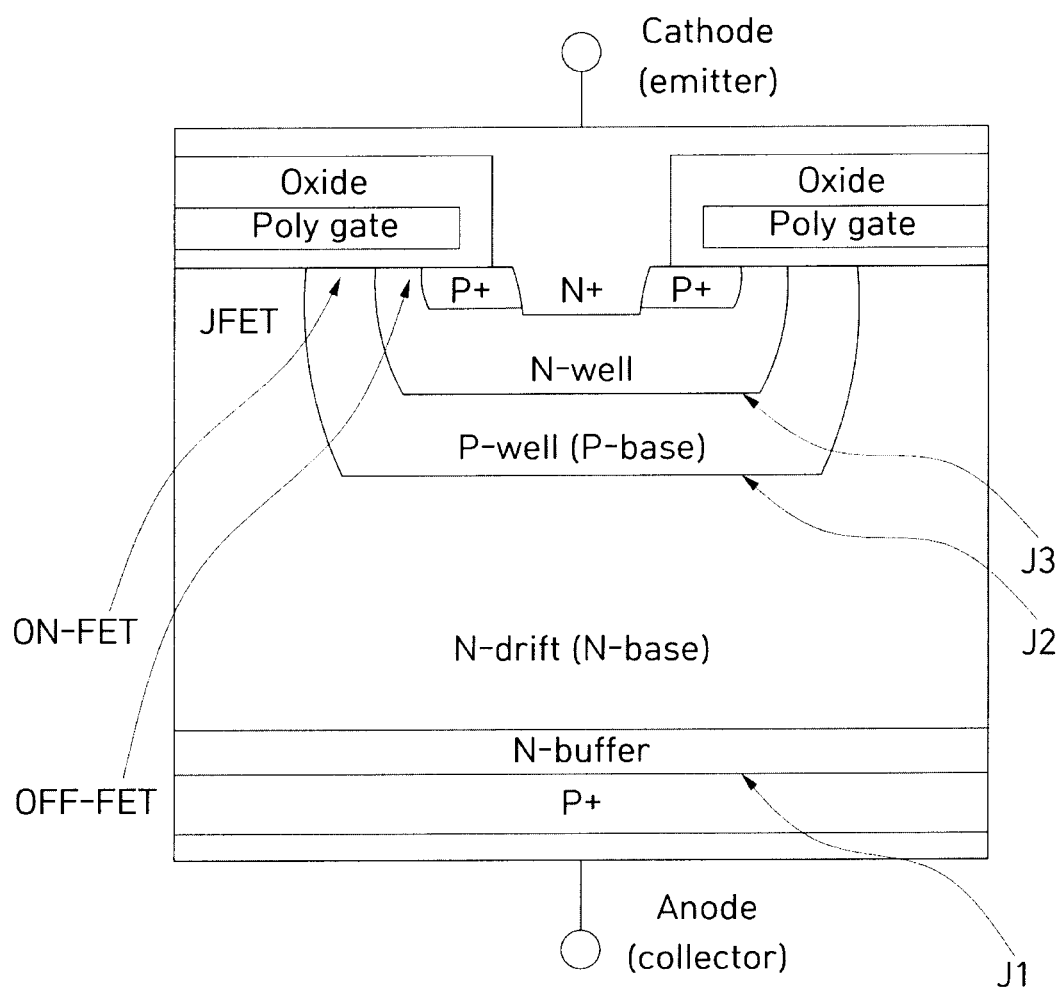
FIG. 1A is a schematic diagram illustrating a cross-sectional structure of a unit cell of a general n-MCT.

Hereinafter, an MCT device and a method of manufacturing the same according to embodiments of the present invention will be described in detail with reference to the accompanying drawings. A width and a thickness of each layer or region illustrated in the drawings are exaggeratedly illustrated for helping understanding, and like reference numerals refer to like elements.

First, in order to help understand embodiments of the present invention, a general MCT device will be briefly described with reference to FIGS. 1A and 1B, and an MCT device according to embodiments of the present invention will be described in detail.

Figure 1B:
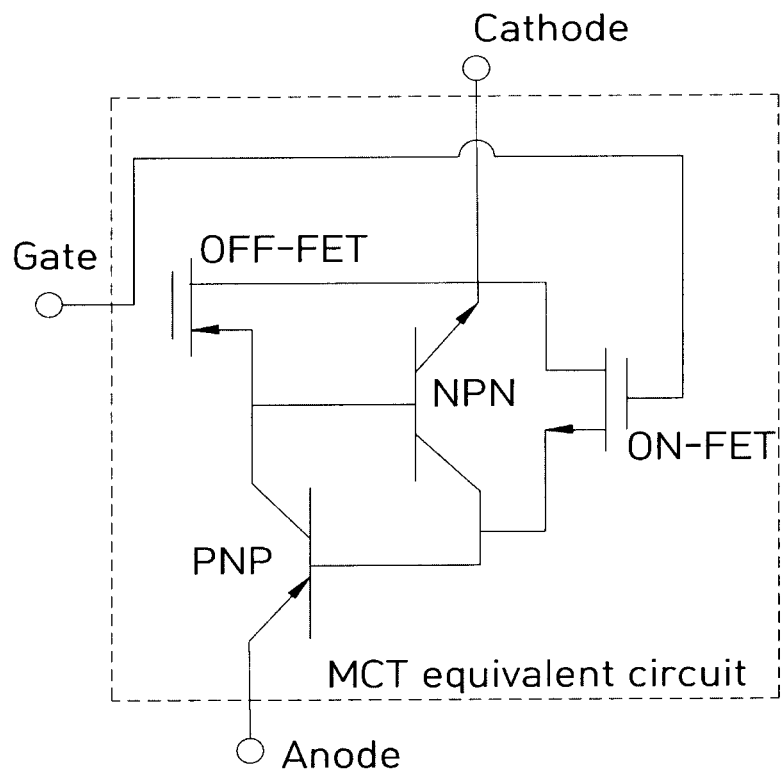
FIG. 1B is a diagram illustrating an equivalent circuit of the MCT device illustrated in FIG. 1A.

FIG. 1A is a schematic diagram illustrating a cross-sectional structure of a unit cell of a general n-MCT, and FIG. 1B is a diagram illustrating an equivalent circuit of the MCT device illustrated in FIG. 1A.

Referring to FIGS. 1A and 1B, a device structure of an MCT may be similar to an IGBT, but may have a triple diffusion structure which further includes a p-MOSFET (off-FET), in addition to an n-MOSFET (on-FET).

Process of Turning on MCT

A process of turning on an MCT will be described below.

When a voltage higher than or equal to a threshold voltage (Vth) of an on-FET is applied to a gate in a state where a positive (+) voltage is applied to an anode, a channel may be formed just under a surface of a p-base (p-type base) region, and thus, the on-FET may be turned on.

An electron current flowing through a channel may flow into an n-base (n-type base) of a PNP BJT (p+/n-base/p-base) and may lower a potential barrier of a junction J1 between a P+ layer and an n-base, and holes may flow in from a lower emitter (lower P+) and may turn on a PNP transistor.

A hole current of the PNP transistor may flow into an NPN BJT (n-emitter/p-base/n-base) and may lower a potential barrier of a junction surface J3 between an emitter (n-well) and a p-base, and electrons may flow in from an upper emitter (n-emitter (i.e., n-well) and may turn on an NPN BJT.

Such an electron current may again flow into a base of the PNP BJT, and thus, a PNPN thyristor may be turned on. An operation of turning on a thyristor described above may be referred to as a regenerative operation.

Process of Turning Off MCT

A process of turning off an MCT will be described below.

When a negative voltage higher than or equal to a threshold voltage (Vth) of an on-FET is applied to a gate when the MCT is in a turn-on state, an off-FET may be turned on, and thus, another flow through which a hole flows may be formed, whereby a hole of a p-base may be removed.

Therefore, the potential barrier of the junction surface J3 may increase, and thus, the injection of an electron from an n-emitter (an n-well) may stop and an NPN BJT may be turned off, whereby a regenerative operation of a thyristor may stop. Electrons remaining in an n-base may be removed by recombination thereof, and thus, the MCT may be turned off.

In the MCT device described above, the current driving capability of a device may be determined based on the turn-off performance thereof, and thus, an off FET having a short channel length should be formed.

Moreover, in order to prevent device damage in a turn-off process, an off-FET in the MCT device should have a uniform characteristic, and thus, it is required to form an off-FET having a uniform channel length.

In an embodiment of the present invention, an off-FET having a short channel length for determining the current driving capability of the MCT device may be designed to have the same environment in all regions of the MCT device, and a channel region of the off-FET may be formed by using a self-align process of a method of forming recessing a spacer, thereby enhancing current driving capability and the uniformity of a device operation.

Moreover, in an embodiment of the present invention, a channel ion may be selectively implanted into the channel region of the off-FET, and thus, the turn-off performance of the MCT may be enhanced by turning on the off-FET on the basis of a low gate voltage, and simultaneously, the MCT device may be turned off based on a gate voltage of 0 V.

Embodiment 1 of Method of Manufacturing MCT Device

In the following description, an example where a lower base (an n-base) is based on an n-MCT) will be described, but when types of all impurities or dopants are opposite, a p-MCT device may be implemented. That is, when first conductive type impurities are p-type impurities (p-impurities), second conductive type impurities may be n-type impurities (n-impurities), and when the first conductive type impurities are n-impurities, the second conductive type impurities may be p-impurities.

FIGS. 2 to 11 are cross-sectional views for describing a process of manufacturing an MCT device according to an embodiment of the present invention.

Figure 2:
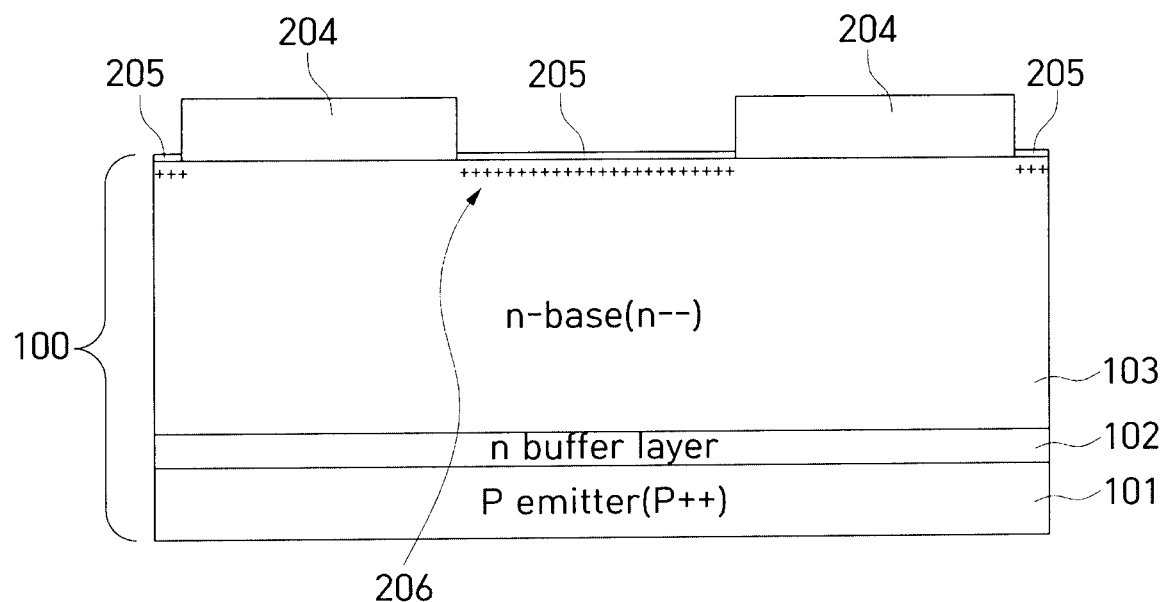
FIGS. 2 to 11 are cross-sectional views for describing a process of manufacturing an MCT device according to an embodiment of the present invention.

First, referring to FIG. 2, a substrate 100 may be prepared.

The substrate 100 may include a p-type emitter layer (a p-emitter layer or a lower emitter) 101 on which p-impurities are doped at a high concentration (p++), an n-type buffer layer (an n-buffer layer) 102 formed on the p-emitter layer 101, and an n-type base layer (an n-base layer or a lower base) 103 formed on the n-buffer layer 102. In this case, the n-base layer 103 may be a layer on which n-impurities are doped at a low concentration (n--).

A wafer, where the p-emitter layer 101, the n-buffer layer 102, and the n-base layer 103 are sequentially grown, may be used as a substrate for manufacturing the MCT device.

As another example, by using a wafer, on which n-impurities are doped at a low concentration (n--), as a substrate, an n-buffer layer and a p-emitter layer may be separately formed on a rear surface of the wafer.

Moreover, p-impurities doped on the p-emitter layer 101 may be, for example, Group 3 elements such as boron (B) and aluminum (Al), and a doping concentration of the p-impurities may be, for example, about $5 \times 10^{18}$ cm$^{-3}$ or more.

Moreover, n-impurities doped on the n-buffer layer 102 may be, for example, Group 5 elements such as phosphorus (P) and arsenic (As), and a doping concentration of the n-impurities may be, for example, about $1 \times 10^{16}$ cm$^{-3}$ to about $1 \times 10^{18}$ cm$^{-3}$. Also, a thickness of the n-buffer layer 102 may be, for example, about 1 μm to about 10 μm.

A doping concentration and a thickness of n-impurities doped on the n-base layer 103 may be determined based on a blocking voltage or a breakdown voltage of a semiconductor device which is to be manufactured.

In a silicon power semiconductor device, the n-impurities doped on the n-base layer 103 may be, for example, Group 5 elements such as P and As, and a doping concentration of the n-impurities may be, for example, about $1 \times 10^{16}$ cm$^{-3}$ or less. Also, a thickness of the n-base layer 103 may be, for example, about 10 μm or more.

When the substrate 100 is prepared, a process of forming (or growing) a first oxide layer 204 on a surface of the substrate 100 (a surface of the n-base layer 103) may be performed.

The first oxide layer 204 may be formed by, for example, an oxidation process. Here, the first oxide layer 204 may be referred to as a sacrificial oxide layer. A thickness of the first oxide layer 204 may be, for example, about 0.5 μm or more.

Subsequently, in order to upward expose a portion of the surface of the substrate 100, a process of removing a portion of the first oxide layer 204 formed on the n-base layer 103 may be performed by using a photolithography process and an etching process.

Figure 3:
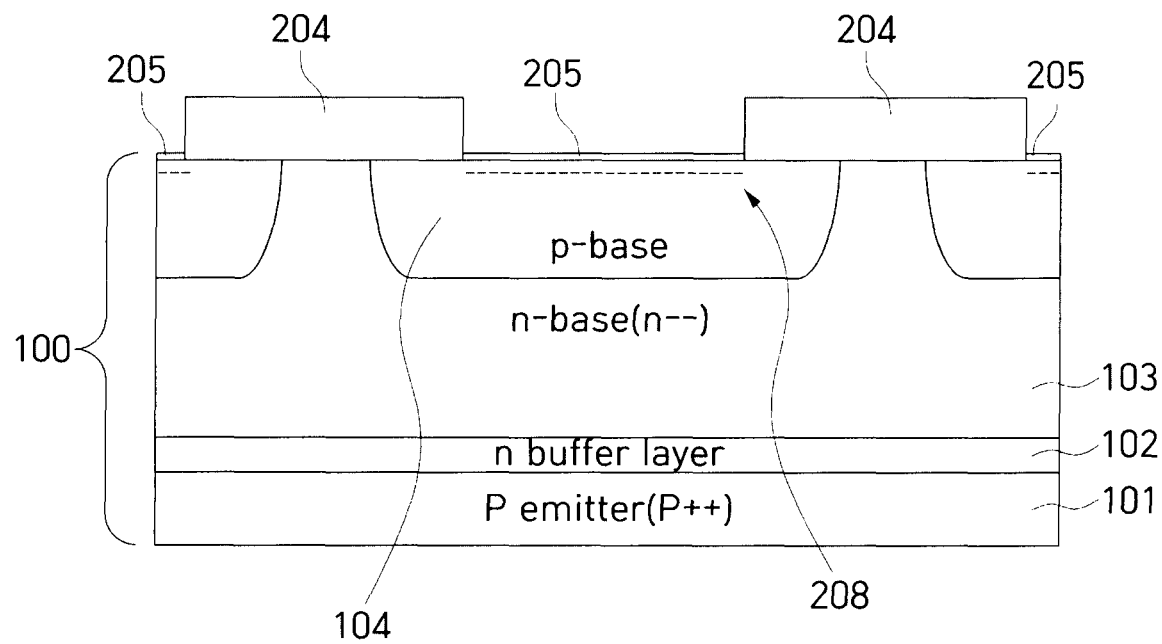

A p-type base region (p-base or upper base) which is to be formed may be defined in the n-base layer 103, and a p-base region 104 is illustrated in FIG. 3.

Subsequently, a process of forming (or growing) a second oxide layer 205 on a surface of the n-base layer 103 upward exposed by removing the first oxide layer 204 may be performed.

The second oxide layer 205 may protect the surface of the substrate 100 (or the surface of the n-base layer 103) from an ion implantation process or a vacuum plasma doping process performed in a subsequent process. A thickness of the second oxide layer 205 may be, for example, about 10 nm to about 100 nm.

Subsequently, by using the ion implantation process (or the vacuum plasma doping process), a process of implanting p-impurities 206 into the n-base layer 103 through the upward-exposed surface of the n-base layer 103 so as to form the p-base region (104 of FIG. 3) may be performed.

The p-impurities 206 implanted into the n-base layer 103 may be, for example, Group 3 elements such as B and Al, and an ion dose of the p-impurities 206 may be, for example, about $1 \times 10^{13}$ cm$^{-2}$ to about $1 \times 10^{14}$ cm$^{-2}$.

Subsequently, referring to FIG. 3, a diffusion process of diffusing the p-impurities, ion-implanted into the n-base layer 103, to an inner portion of the n-base layer 103 may be performed.

The diffusion process may be, for example, a high temperature annealing process. A diffusion depth (a doping depth or a junction depth) of the p-impurities may be, for example, about 5 μm to about 10 μm.

Subsequently, in order to form an n-emitter region (an n-emitter or an upper emitter) 105 of FIG. 4 to be described below, an ion implantation process of implanting n-impurities 208 (for example, P, A, or the like) into a region under a surface of the p-base region 104 may be performed. In this case, the first oxide layer 204 may act as an ion implantation mask in an ion implantation process based on n-impurities for forming the n-emitter region 105.

The n-impurities 208 for forming the n-emitter region (105 of FIG. 4) may be, for example, P or As, and an ion dose of the n-impurities 208 may be, for example, about $1 \times 10^{13}$ cm$^{-2}$ to about $1 \times 10^{14}$ cm$^{-2}$.

Subsequently, referring to FIG. 4, a diffusion process of diffusing the n-impurities 208, ion-implanted into a region under the surface of the p-base region 104, to an inner portion off the p-base region 104 may be performed. The n-emitter region 105 may be formed in the p-base region 104 by the diffusion process.

The diffusion process may be, for example, a high temperature thermal treatment process. A diffusion depth (a doping depth or a junction depth) of the n-impurities 208 diffused to the inner portion of the p-base region 104 by the diffusion process may be, for example, about 1 μm to about 5 μm.

In a diffusion process based on the p-impurities (206 of FIG. 2) for forming the p-base region 104, the p-impurities (206 of FIG. 2) may be deeply diffused in a lateral direction, and a junction surface between the p-base region 104 and the n-base layer 103 may deeply extend in the lateral direction.

Figure 4:
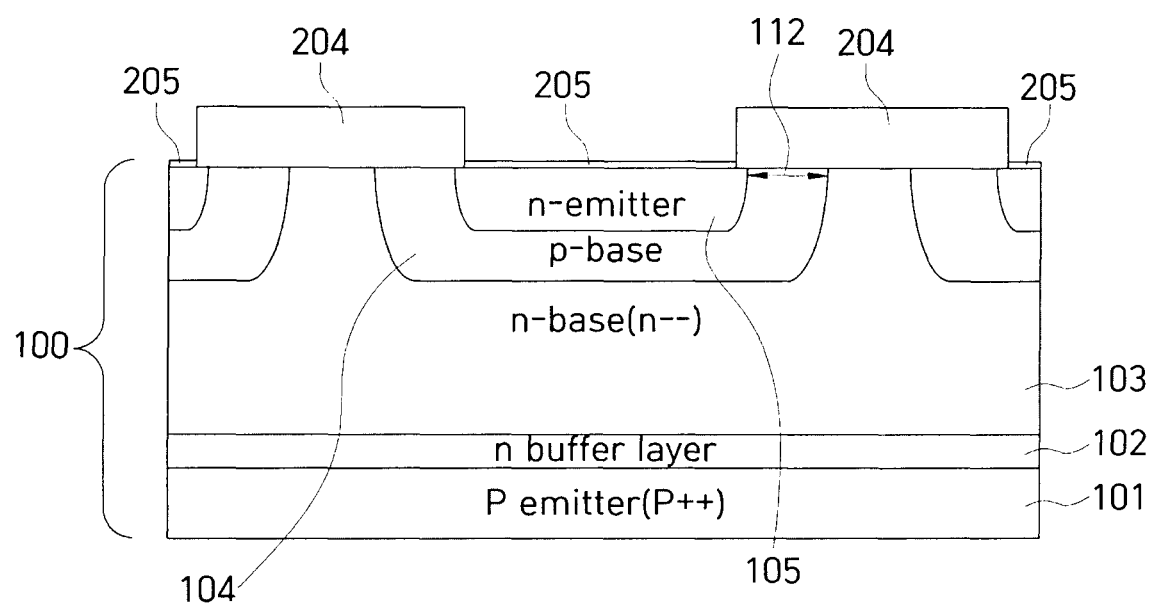

On the other hand, in a diffusion process based on the n-impurities (208 of FIG. 3) for forming the n-emitter region 105 of FIG. 4, a junction surface between the n-emitter region 105 (an n-emitter) and the p-base region 104 may not deeply extend in the lateral direction due to the diffusion of the p-impurities (206 of FIG. 2).

When an ion dose of the n-impurities (208 of FIG. 3) increases, the junction surface of the n-emitter region 105 may deeply extend in the lateral direction. In this case, however, a surface density of the n-emitter region 105 forming a channel of an off-FET may increase, and thus, a threshold voltage of the off-FET may have a negative value which is very large, causing a reduction in the current driving capability of the off-FET.

A channel region 112 of an on-FET may be formed in a region under the surface of the p-base region 104. Here, the channel region 112 of the on-FET may be a region between a junction surface between the n-base region 103 and the p-base region 104 and a junction surface between the p-base region 104 and the n-emitter region 105, in a region under the surface of the p-base region 104.

Although not shown, after the diffusion process performed on the p-base region 104 described above with reference to FIG. 3 is performed, the n-emitter region 105 may be formed by removing all of the first oxide layer 204 and the second oxide layer 205, growing a separate oxide layer, patterning the n-emitter region 105, and performing an ion implantation process and a diffusion process on the above-described n-impurities (208 of FIG. 3).

Subsequently, referring to FIG. 5, in order to secure a channel region 110 of an off-FET which will be described below with reference to FIG. 6, a process of forming a spacer 211 on a side surface of the first oxide layer 204 through a deposition process and an etch-back process may be performed.

In the deposition process, a spacer material layer may be deposited on a whole surface of the first oxide layer 204. In the etch-back process, by etching the spacer material layer, a spacer 211 may be formed along a side surface of the first oxide layer 204. Here, the etch-back process may be, for example, a plasma etching process.

Subsequently, a third oxide layer 212 for protecting a substrate surface from an ion implantation process which is to be performed in a subsequent process may be additionally grown. A thickness of the third oxide layer 212 may be, for example, about 10 nm to about 100 nm.

The spacer 211 may be, for example, oxide or nitride. A thickness of the spacer 211 may be, for example, about 200 nm or more.

As described above, in the MCT device, because turn-off performance determines the current driving capability of a device, in order to enhance the current driving capability of an off-FET, a channel length of the channel region 110 of the off-FET should be short, and all MCT devices integrated into one wafer should have a uniform channel length.

Subsequently, referring to FIG. 6, a photolithography process of forming a photoresist pattern 214 on the n-emitter region 105 with a certain interval from the spacer 211 may be performed for forming a p-drain region (or a p-type drain region) 106 (p+) for performing a function of a drain of the off-FET.

Subsequently, a process of ion-implanting p-impurities (for example, B, Al, or the like) into the n-emitter region 105 by using the photoresist pattern 214 as an ion-implantation mask to form the p-drain region 106 of the off-FET may be performed. An ion dose of the p-impurities may be, for example, about $1\times10^{15}$ cm$^{-2}$ or more.

Through such a process, the off-FET channel region 110 may be formed in the lateral direction from a region between an end portion (a junction surface) of the n-emitter region 105 and an end portion (a junction surface) of the p-drain region 106 of the off-FET or a region under the spacer 211.

Through a p+ ion implantation process and a self-align process using the forming of the spacer, the off-FET channel region 110 having a short channel length and a uniform length may be formed.

Subsequently, referring to FIG. 7, after the p-drain region 106 of the off-FET is formed, a process of removing the photoresist pattern 214 used as an ion implantation mask may be performed.

Subsequently, an etching process of removing a portion of the first oxide layer 204 and the spacer 211 to upward expose the off-FET channel region 110 or a portion of the off-FET channel region 110 may be performed. Here, the etching process of removing a portion of the first oxide layer 204 and the spacer 211 may be, for example, an isotropic etching process.

The isotropic etching process may be, for example, a wet etching process. In this case, when the spacer 211 is oxide, the spacer 211 may be etched at a higher speed than the first oxide layer 204 in the wet etching process.

When the spacer 211 is oxide, the spacer 211 may be, for example, oxide grown through a chemical vapor deposition (CVD) process, and the first oxide layer 204 may be oxide grown through a thermal oxidation process.

Subsequently, referring to FIG. 8, an ion implantation process of implanting p-impurities (for example, B, Al, or the like) into the channel region 110 of the off-FET may be performed. In this case, an ion dose of the p-impurities ion-implanted into the channel region 110 of the off-FET may be, for example, about $1\times10^{11}$ cm$^{-2}$ or about $1\times10^{11}$ cm$^{-2}$.

Based on ion-implantation performed on the off-FET channel region 110, a turn-on voltage of the off-FET may be adjusted, thereby enhancing an off-FET characteristic. Also, in the channel region 110 of the off-FET, a PMOS channel of a depletion mode may be formed, and thus, the off-FET may be turned on based on a gate voltage of 0 V, thereby turning off the MCT device.

Figure 9:
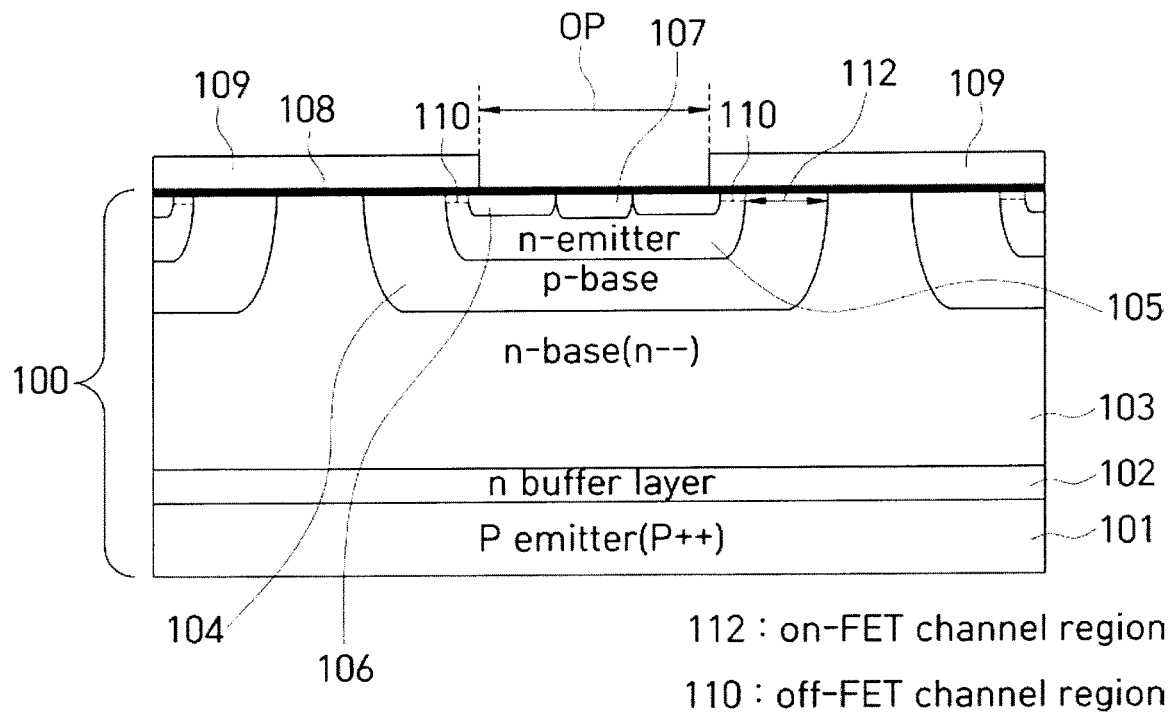

Subsequently, referring to FIG. 9, the first oxide layer 204 and oxide layers formed for protecting the surface of the substrate 100 in the ion implantation process may be removed by using an etching process, and then, a process of sequentially growing a gate insulation layer 108 and a gate electrode layer 109 on a whole surface of the substrate 100 may be performed.

Subsequently, a process of etching the gate electrode layer 109 to include an opening portion OP upward exposing an n-type (n+) doping region (an n-doping region) 107 and the gate insulation layer 108 on a portion of the p-drain region 106 of the off-FET surrounding the n-doping region 107 may be performed. In order to form the opening portion OP, a photolithography process may be further performed.

Subsequently, in order to enhance an ohmic contact characteristic and an electron injection characteristic of the n-emitter region 105, a process of forming the n-doping region 107 surrounded by the p-drain region 106 of the off-FET may be performed.

The n-doping region 107 may be formed by ion-implanting n-impurities (for example, P, As, or the like) into the p-drain region 106 of the off-FET by using, for example, a photoresist pattern (not shown) as an ion implantation mask. Here, an ion dose of the n-impurities may be, for example, about $1 \times 10^{15}$ cm$^{-2}$ or more.

Figure 10:
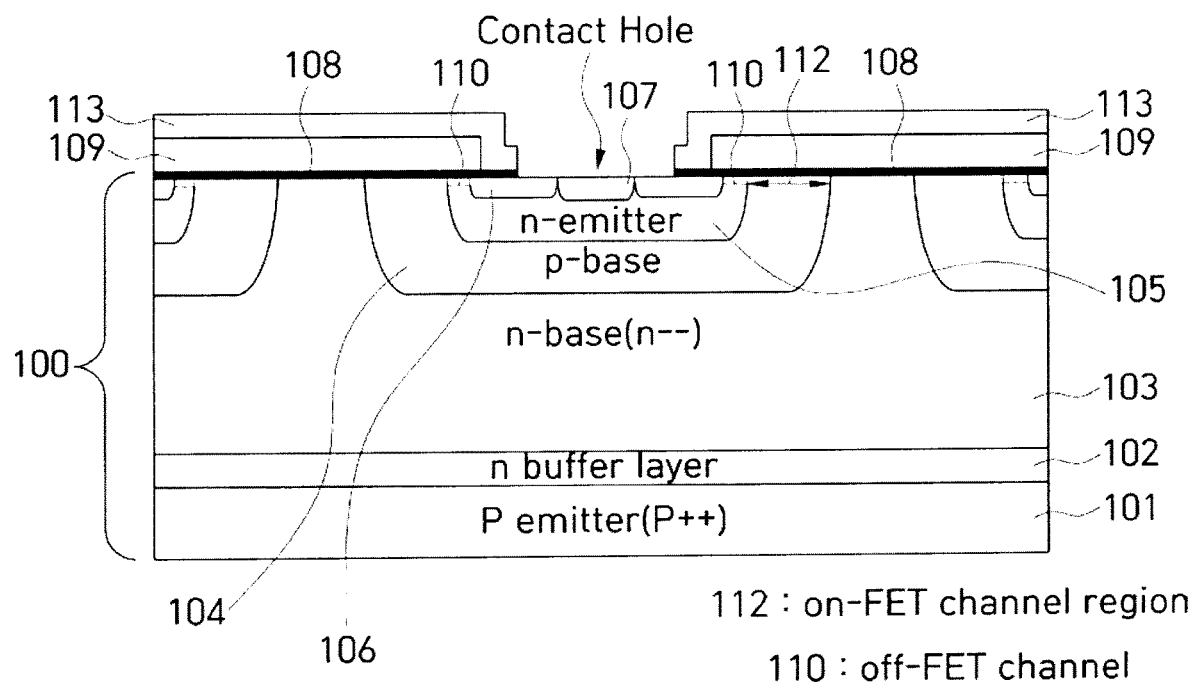

Subsequently, referring to FIG. 10, a process of depositing an interlayer insulation layer 113 on the gate insulation layer 108 upward exposed by the gate electrode layer 109 and the opening portion OP may be performed.

Subsequently, by using a photolithography process and an etching process, the gate insulation layer 108 and the interlayer insulation layer 113 may be removed to form a contact hole which upward exposes the n+ doping region 107 and a portion of the p-drain region 106 of the off-FET.

Figure 11:
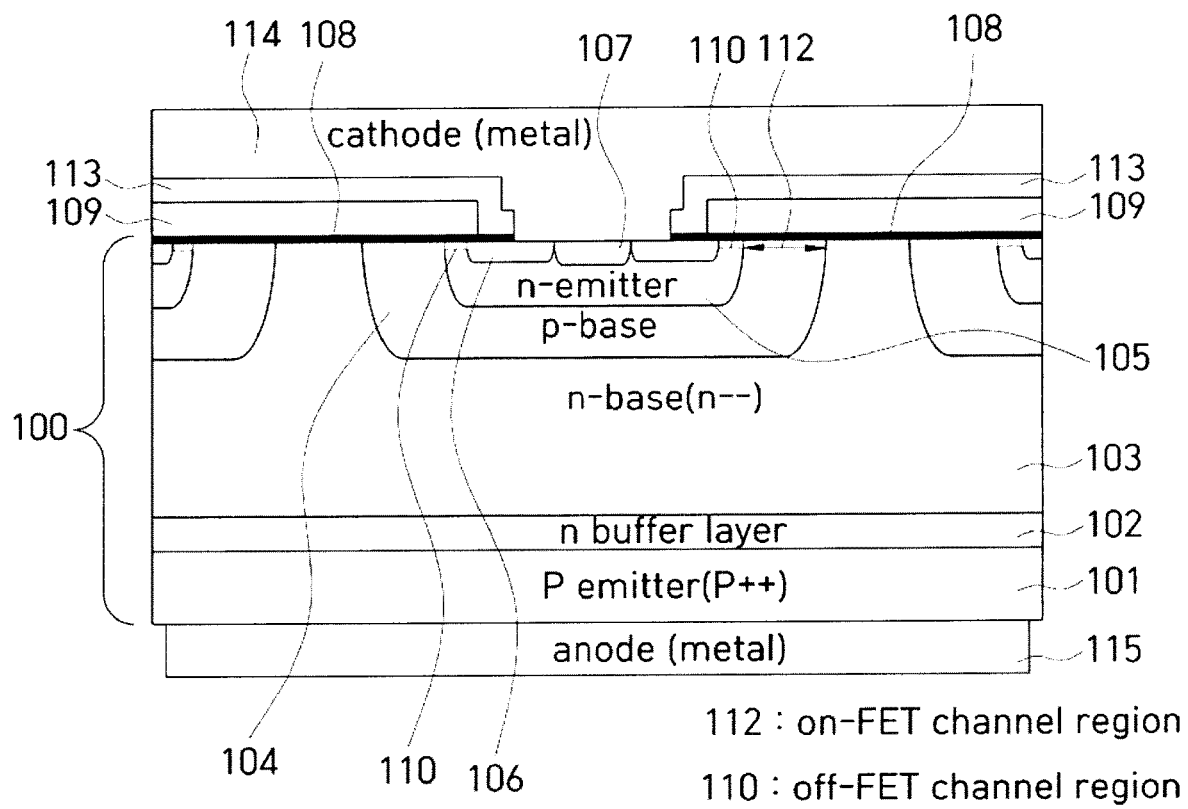

Subsequently, referring to FIG. 11, a process of forming (or depositing) an upper metal layer 114, which is to be used as a cathode electrode, on the interlayer insulation layer 113 and the upward exposed n+ doping region 107 and the upward exposed portion of the p-drain region 106 of the off-FET may be performed.

Moreover, a process of forming (depositing) a lower metal layer 115, which is to be used as an anode electrode, on a bottom surface of the p-emitter layer 101 may be performed.

A process of manufacturing the MCT device may be completed by forming the upper metal layer 114 and the lower metal layer 115.

In a process of manufacturing the MCT device described above, an off-FET channel having a uniform and short length may be formed by using a self-align process of a method of forming and recessing a spacer, and thus, the current driving capability of an off-FET and the uniformity of a device operation may be enhanced.

Moreover, in the embodiments of the present invention, channel ion implantation may be selectively performed on a channel region of an off-FET, and thus, the turn-off performance of the MCT may be enhanced by turning on the off-FET on the basis of a low gate voltage. Also, an off-FET channel of the depletion mode may be formed, and thus, the MCT device may be turned off based on a gate voltage of 0 V.

Embodiment 2 of Method of Manufacturing MCT Device

In a process of manufacturing the MCT device illustrated in FIGS. 2 to 11, an ion implantation process performed on the off-FET channel region 107 may be performed as the following process, instead of the method described above with reference to FIGS. 7 and 8.

Figure 7:
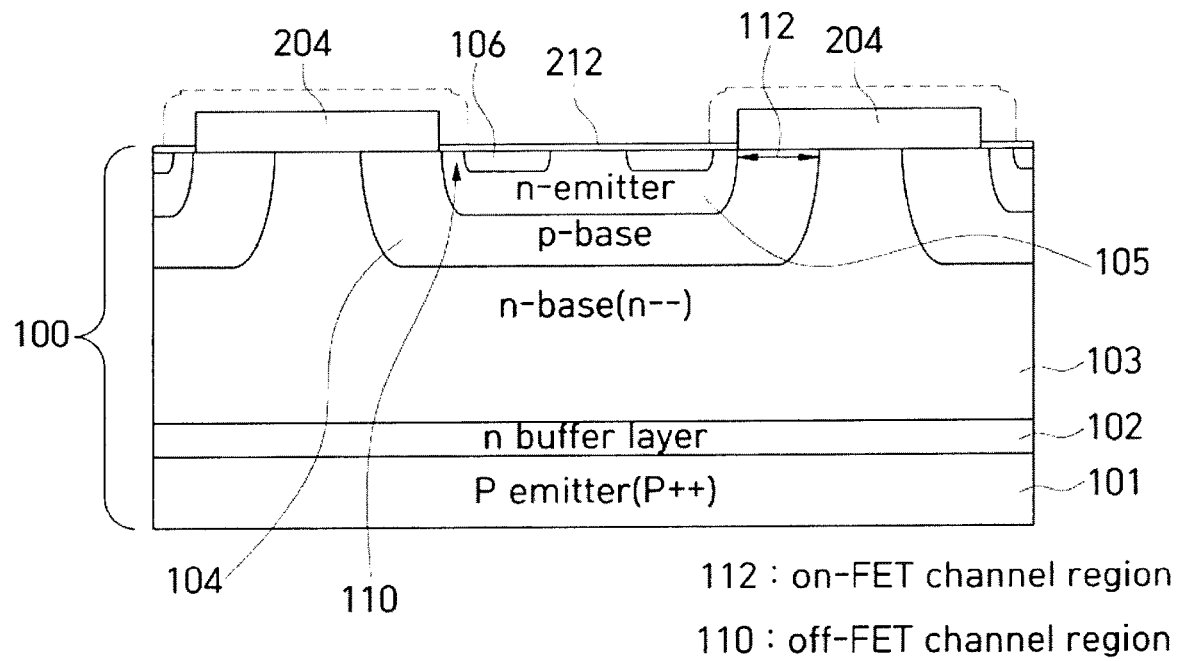
Figure 8:
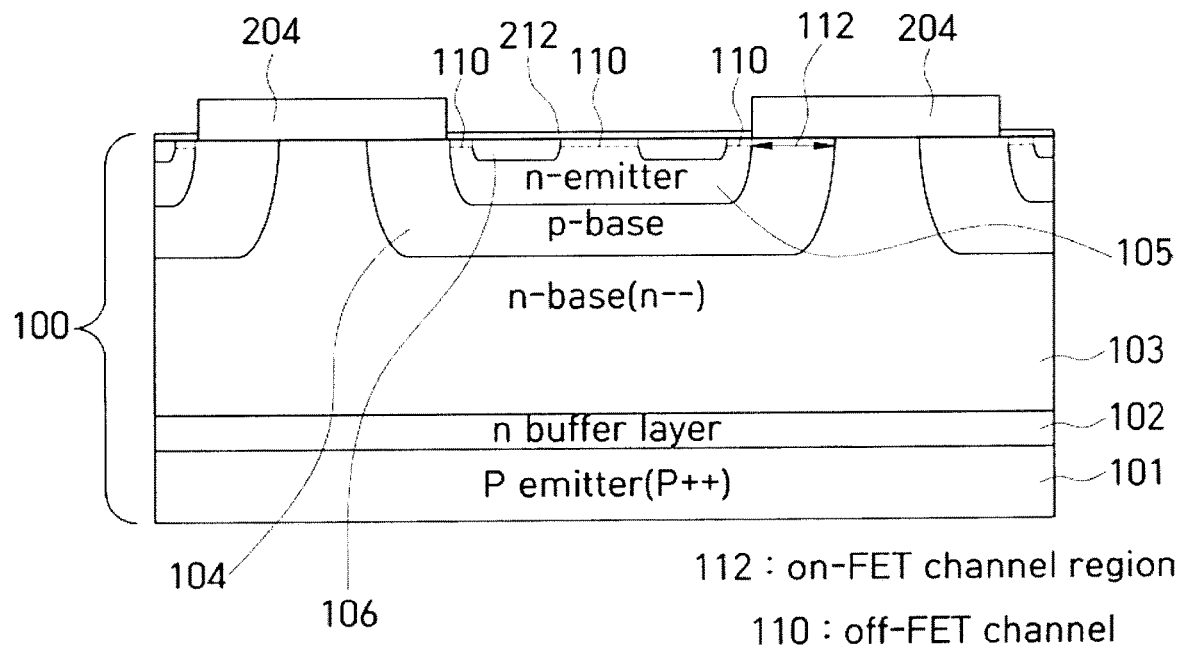
Figure 12:
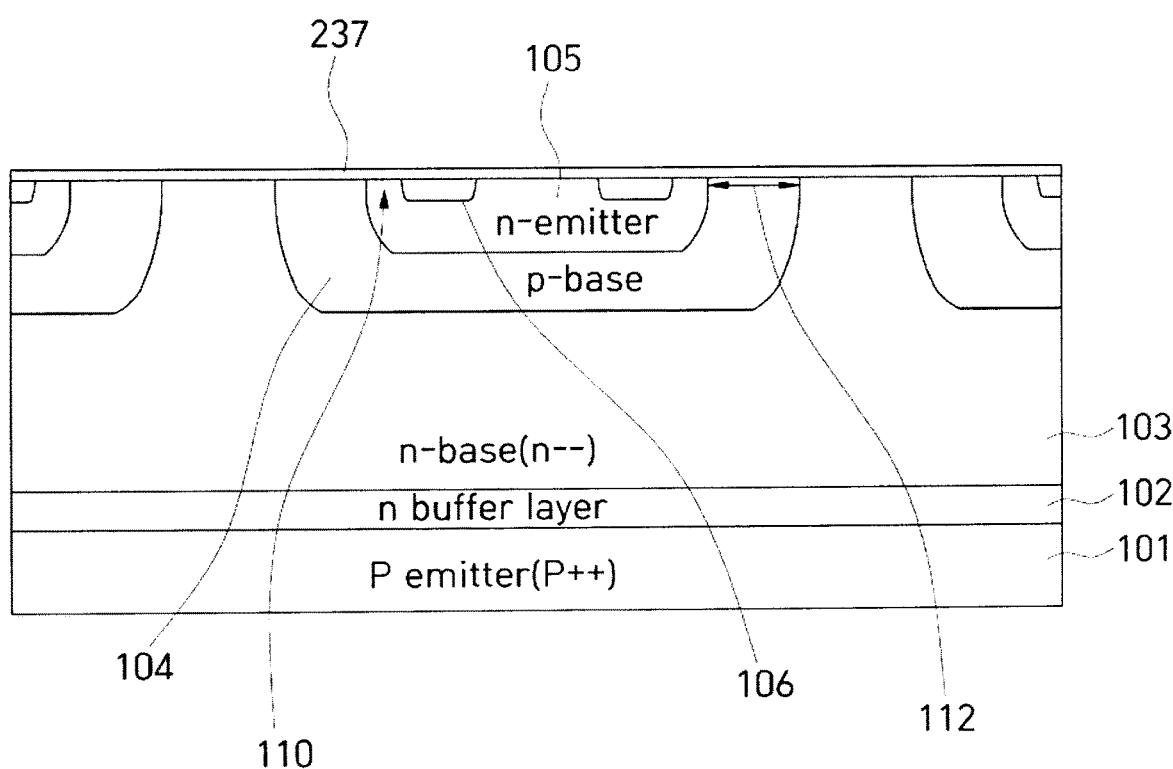
FIGS. 12 and 13 are cross-sectional views for describing another embodiment of a process of ion-implanting p-impurities (p-type impurities) into an off-FET channel region in FIGS. 7 and 8.
Figure 13:
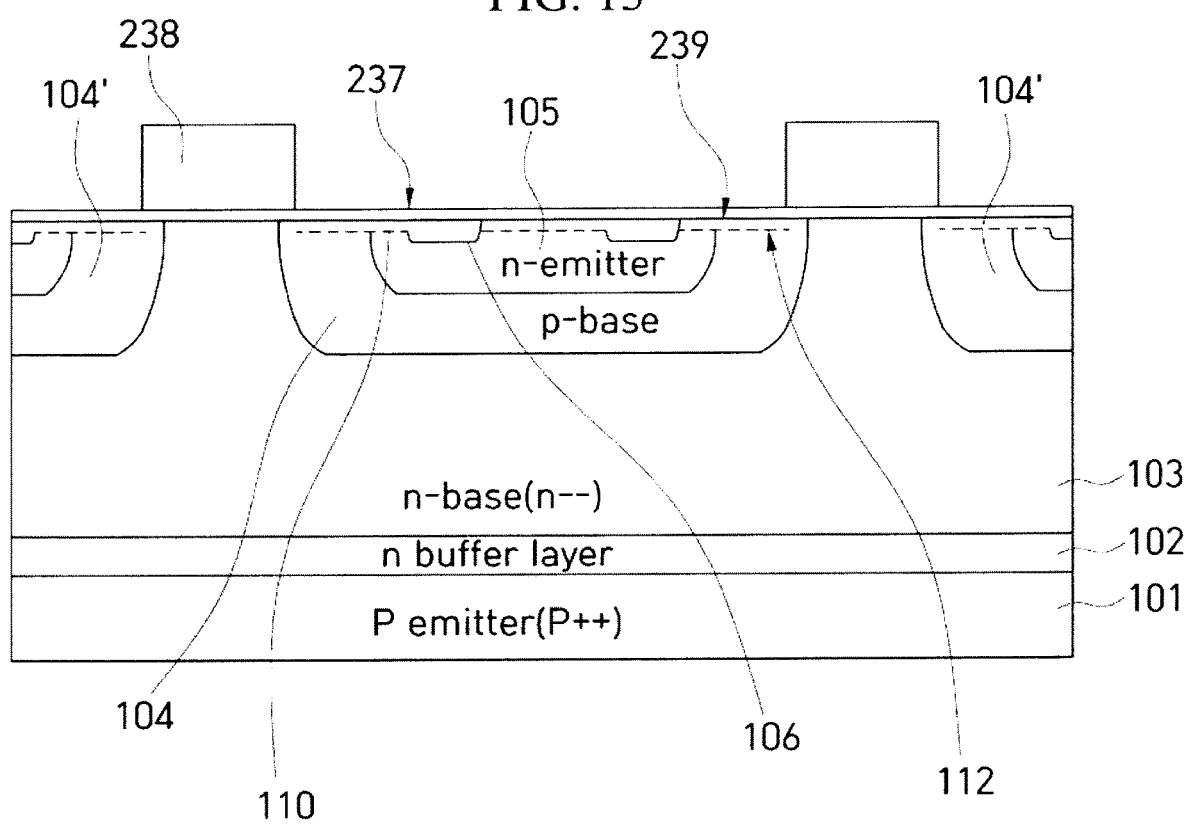

FIGS. 12 and 13 are cross-sectional views for describing another embodiment of a process of ion-implanting p-impurities (p-type impurities) into an off-FET channel region in FIGS. 7 and 8.

Figure 6:
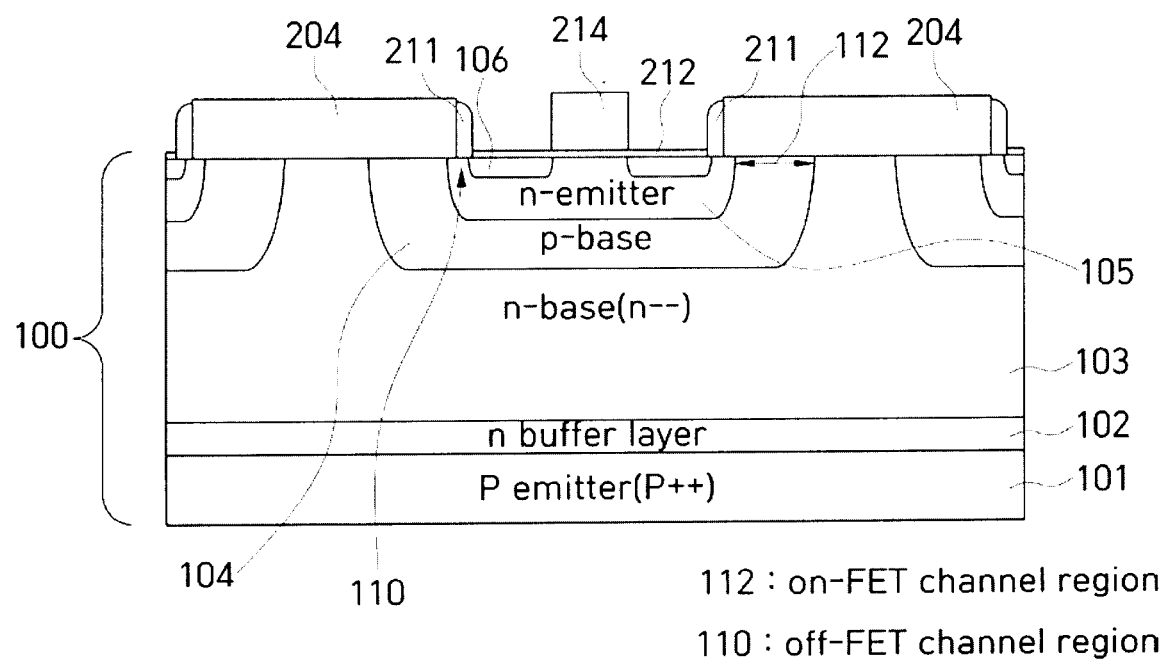

First, referring to FIG. 12, after the p-drain region 106 is formed through the process of FIG. 6, a process of removing the photoresist pattern 214, the spacer 211, the first oxide layer 204, and a third oxide layer (212 of FIG. 6) may be performed.

Subsequently, an oxidation process of growing a fifth oxide layer 237 on the surface of the substrate 100 upward exposed by removing the first oxide layer 204 and the third oxide layer (212 of FIG. 6) may be performed. In this case, a thickness of the fifth oxide layer 237 may be, for example, about 10 nm to about 100 nm.

Subsequently, referring to FIG. 13, a photolithography process of forming a photoresist pattern 238 on the fifth oxide layer 237 may be performed. The photoresist pattern 238 may be formed between the p-base region 104 and another p-base region 104' adjacent to the p-base region 104.

By using the photoresist pattern 238 as an ion implantation mask, an ion implantation process of implanting p-impurities (for example, B, Al, or the like) into the channel region 110 of the off-FET and a partial region (or a whole region) of the channel region 112 of the on-FET adjacent to the channel region 110 of the off-FET may be performed.

Based on such an ion implantation process, a threshold voltage adjustment layer 239 may be formed.

Although not shown, the threshold voltage adjustment layer 239 may be formed on a whole surface of the substrate 100 without forming the photoresist pattern 238.

An ion dose of the threshold voltage adjustment layer 239 may be, for example, about $1 \times 10^{11}$ cm$^{-2}$ or about $1 \times 10^{13}$ cm$^{-2}$. The threshold voltage adjustment layer 239 may be formed by an ion implantation process simultaneously performed on the off-FET channel region 110 and the on-FET channel region 112.

A turn-on voltage of the off-FET may be adjusted based on ion implantation performed on the off-FET channel region 110, and thus, an electrical characteristic of the off-FET may be enhanced and simultaneously a threshold voltage of the on-FET may increase as a stable value on the basis of ion implantation performed on the on-FET channel region 112.

Moreover, in the off-FET channel region 110, a PMOS channel of the depletion mode may be formed, and thus, the off-FET may be turned on based on a gate voltage of 0 V, thereby turning off the MCT device.

Subsequently, after the photoresist pattern 238 and the fifth oxide layer 237 are removed, a process of manufacturing the MCT device may be completed through the processes of FIGS. 9 to 11.

A process of forming the threshold voltage adjustment layer 239 described above with reference to FIGS. 12 and 13 may be applied to all of first to fourth embodiments which will be described below.

Hereinafter, a structural characteristic based on the gate electrode layer 109 in an n-type MCT device (or an n-MCT device) manufactured through the manufacturing processed of FIGS. 2 to 13 will be described.

First Embodiment

Figure 14:
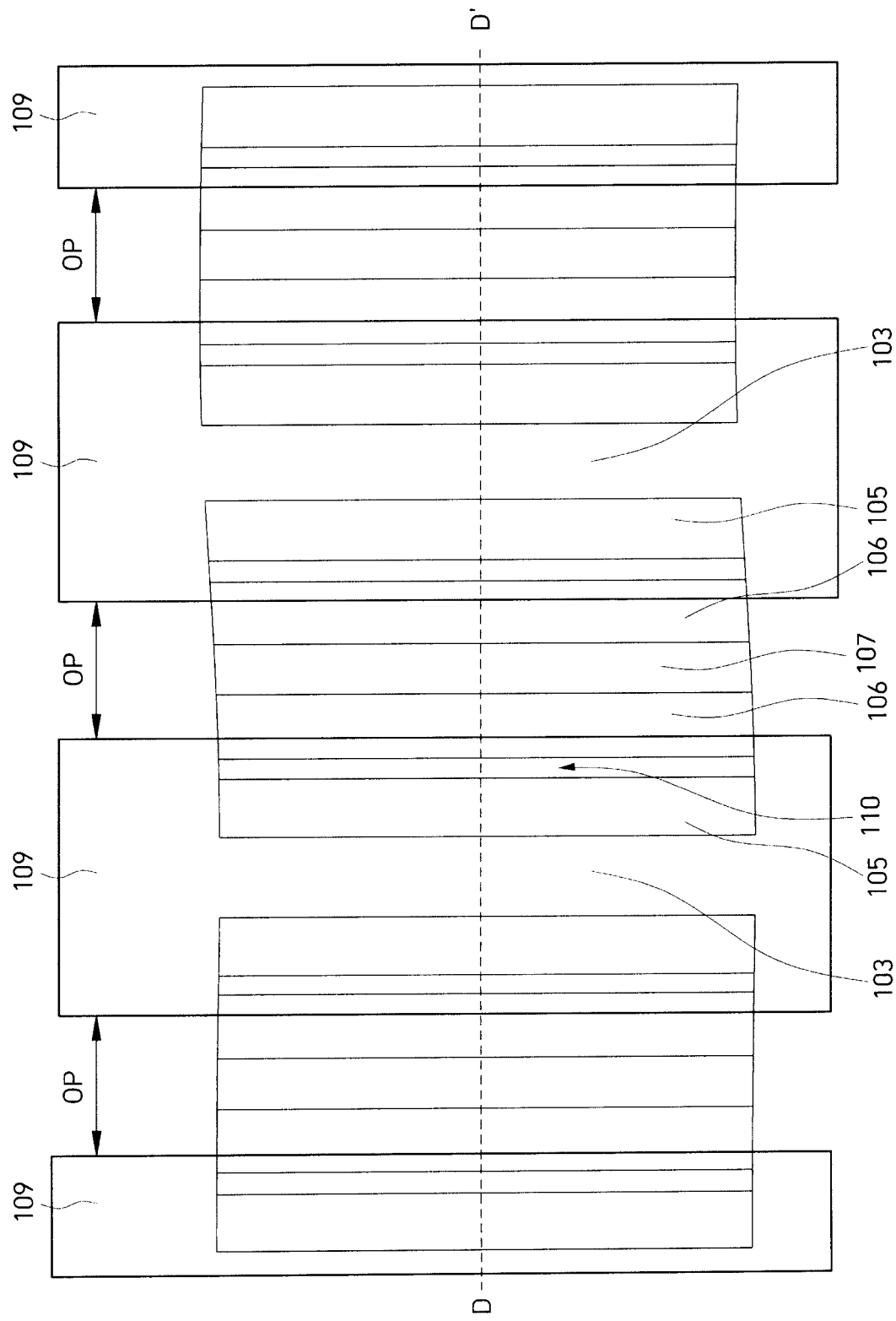
FIG. 14 is a plan view when an MCT device manufactured according to a first embodiment of the present invention is seen from above, in a state where a gate insulation layer, an interlayer insulation, and an upper metal layer are removed.
Figure 15:
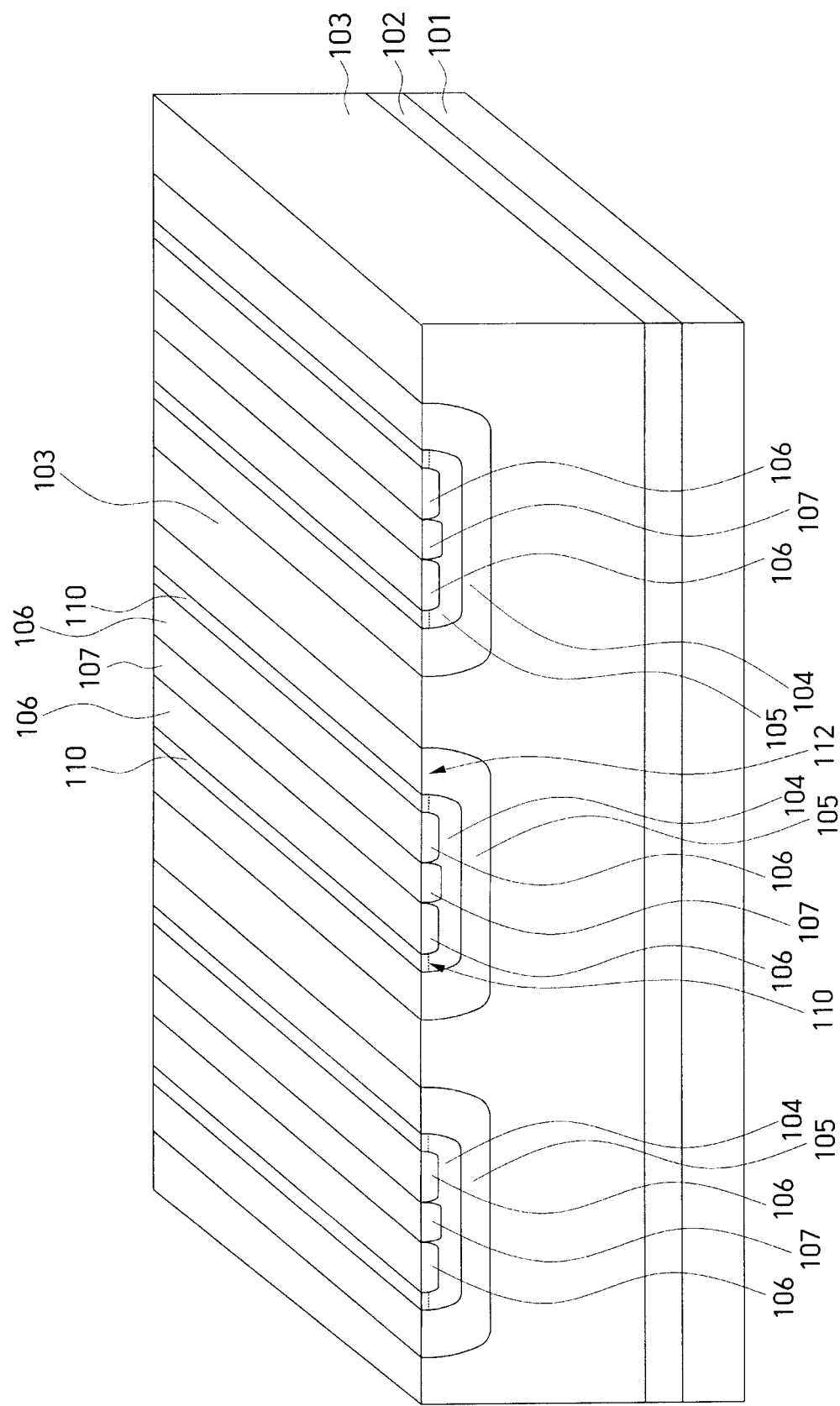
FIG. 15 is a three-dimensional cross-sectional view of an MCT device taken along line D-D' illustrated in FIG. 14.

FIG. 14 is a plan view w % ben an MCT device manufactured according to a first embodiment of the present invention is seen from above, in a state where a gate insulation layer, an interlayer insulation, and an upper metal layer are removed. FIG. 15 is a three-dimensional cross-sectional view of an MCT device taken along line D-D' illustrated in FIG. 14.

Referring to FIGS. 14 and 15, an n-buffer layer 102 may be disposed on a p-emitter layer 101 having a high concentration. An n-base layer 103 acting as a lower base (an n-base) of a PNPN thyristor may be disposed on the n-buffer layer 102.

Through an ion implantation process based on p-impurities, an upper base (i.e., a p-base region) 104 diffused to an inner portion of the n-base layer 103 may be disposed in the n-base layer 103.

Through an ion implantation process based on n-impurities, an n-emitter region 105 formed through diffusion of the n-impurities to the inner portion of the p-base region 104 may be disposed in the p-base region 104. In this case, an on-FET channel region 112 acting as a channel of the on-FET may be disposed under a top surface of the p-base region 104.

An n-doping region 107 and a p-drain region 106 may be disposed in the n-emitter region 105. In this case, the p-drain region 106 may act as a drain of an off-FET.

The n-doping region 107 may contact the n-emitter region 105 to enhance an ohmic contact characteristic of the n-emitter region 105 and to enhance the emitter injection efficiency of an upper NPN BJT.

A region just under a top surface of the n-emitter region 105 may be a channel region 110 of the off-FET. Simultaneously, the channel region 110 of the off-FET may act as a path through which a source current of the on-FET flows.

Ion implantation performed on the channel region 110 of the off-FET may adjust a turn-on voltage of the off-FET to enhance an off-FET characteristic. Also, the channel region 110 of the off-FET may form a PMOS channel of the depletion mode, and thus, the off-FET may be turned on based on a gate voltage of 0 V, thereby turning off the MCT device.

A gate insulation layer 108, a gate electrode layer 109, an interlayer insulation layer 113, an upper metal layer 114, and a lower metal layer 115 formed subsequently may be formed through the manufacturing process described above with reference to FIGS. 9 to 11.

The gate electrode layer 109, as illustrated in FIG. 14, may include a plurality of opening portions OP which upward expose the n-doping region 107 included in one MCT device and a portion of the p-drain region 106 surrounding the n-doping region 107. In this case, the gate electrode layer 109 may be arranged in a line form. Each of the opening portions OP may also be arranged in a line form.

One MCT device may be arranged in a line form on one wafer, and MCT devices arranged on a wafer may have the same structure.

As illustrated in FIGS. 14 and 15, when seen from above, the n-doping region 107 and the p-drain region 106 surrounding the n-doping region 107, which are upward exposed by the opening portion OP having a line form formed in the gate electrode layer 109, may extend in a line shape like the opening portion OP having a line form.

Moreover, when seen from above, the n-emitter region 105 may extend in a line shape.

Therefore, when seen from above, a junction surface between the n-emitter region 105 and the p-base region 104 and a channel region 110 (a path through which an on-FET source current flows) of the off-FET formed between adjacent p-drain regions 106 may have a line shape.

Moreover, when seen from above, a surface of the n-base layer 103 acting as a lower base may be seen in a line shape.

Figure 5:
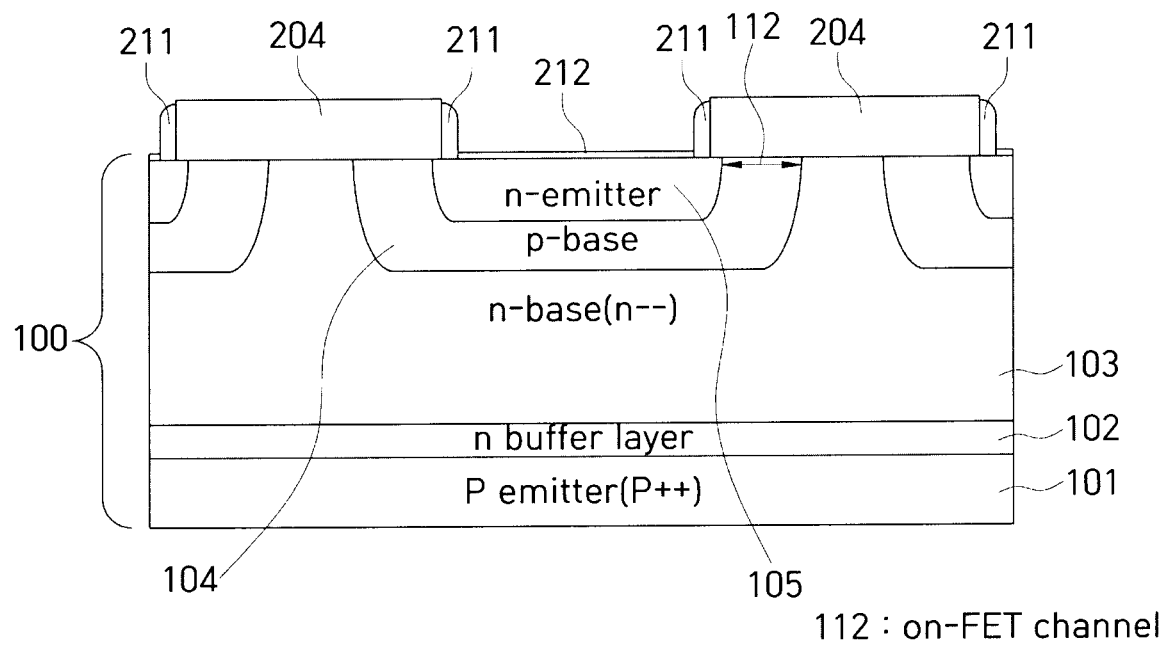

The off-FET channel region 110 and the on-FET channel region 112 having a line shape may have the same width at all positions of the MCT device on the basis of an ion implantation process using the spacer 211, illustrated in FIGS. 5 and 6, as an ion implantation mask, and thus, an off-FET and an on-FET having a uniform characteristic may be formed.

As described above, in the MCT device including the gate electrode layer 109 arranged in a line form, the off-FET channel region 110 and the on-FET channel region 112 may be disposed at an end portion of the gate electrode layer 109 of an MCT device unit cell, and a turn-on characteristic and a turn-off characteristic of the MCT device may be uniformly maintained in all cells.

Moreover, channel ion implantation may be selectively performed on the channel region 110 of the off-FET, and thus, the turn-off performance of the MCT may be enhanced by turning on the off-FET on the basis of a low gate voltage.

Moreover, the off-FET channel region 110 may be formed through ion implantation based on p-impurities to operate in the depletion mode, and thus, the MCT device may be turned off based on a gate voltage of 0 V.

Second Embodiment

Figure 16:
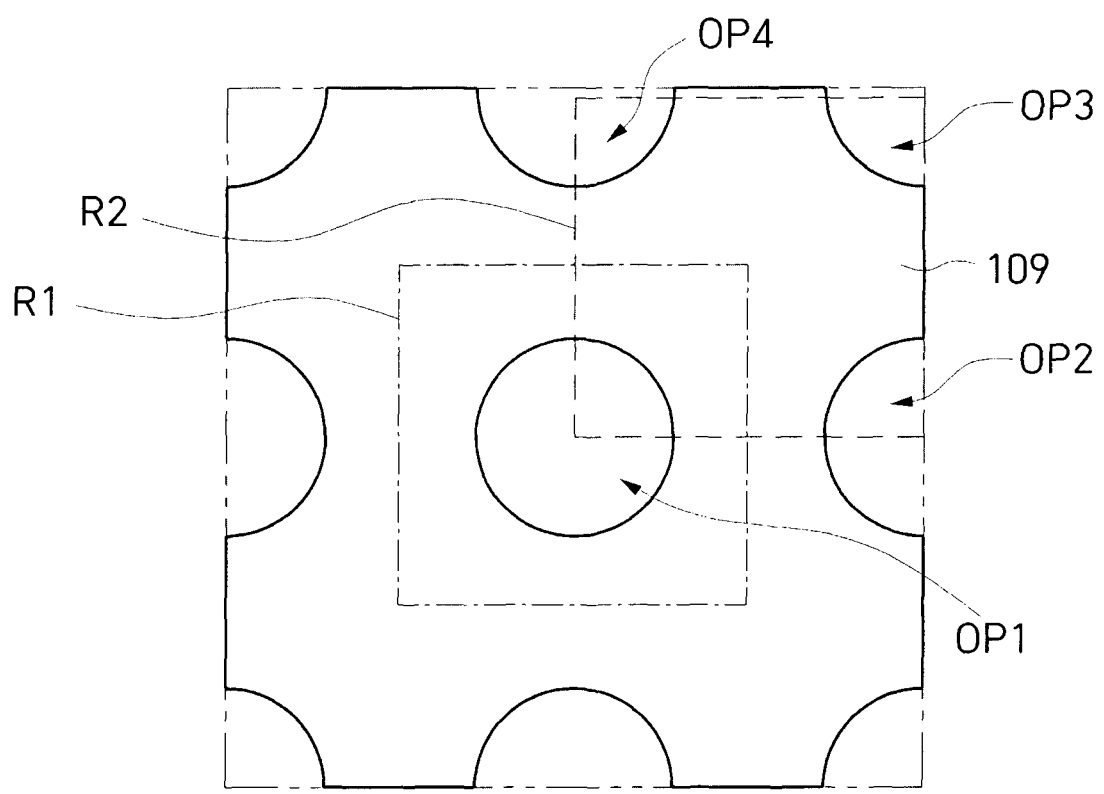
FIG. 16 is a plan view when a gate electrode layer according to a second embodiment of the present invention is seen from above.
Figure 17:
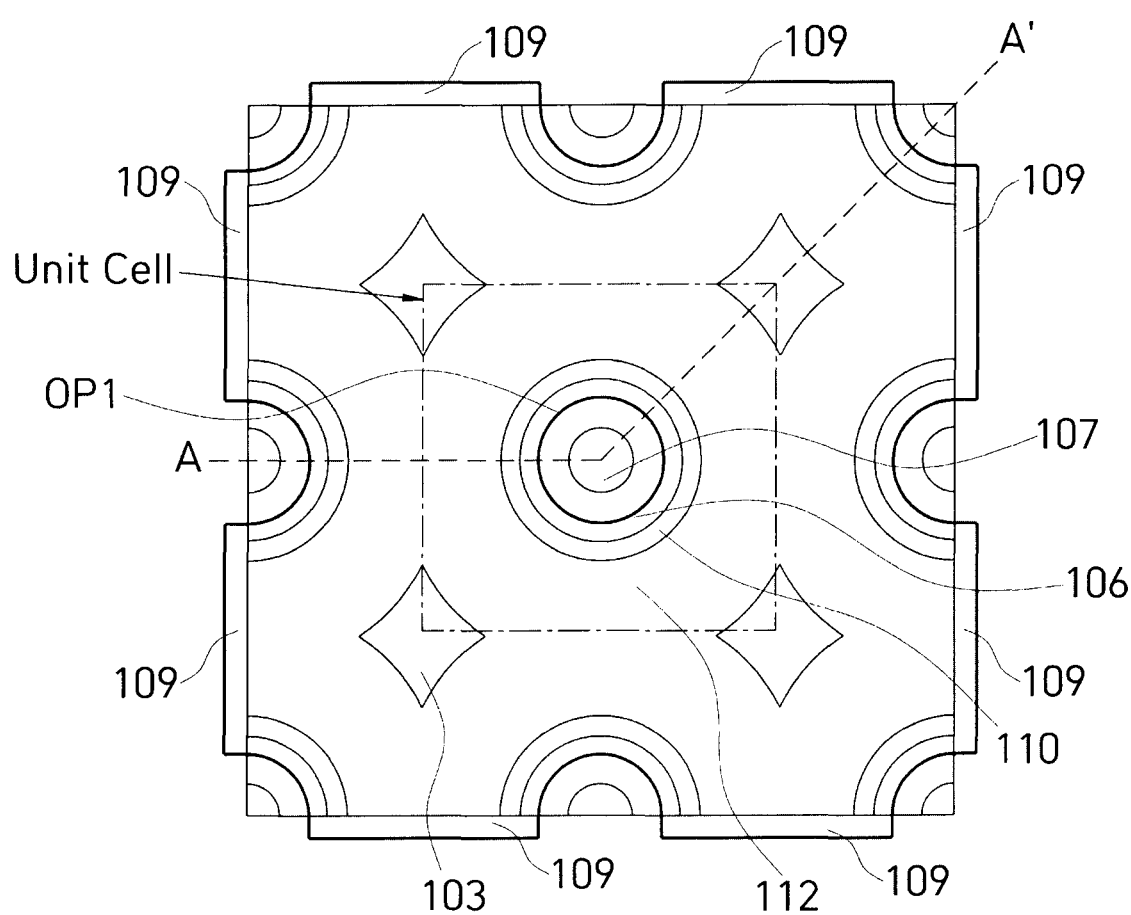
FIG. 17 is a plan view when an MCT device is seen from above, in a state where a gate insulation layer disposed under a gate electrode layer illustrated in FIG. 16 and an interlayer insulation and an upper metal layer disposed on the gate electrode layer are removed.
Figure 18:
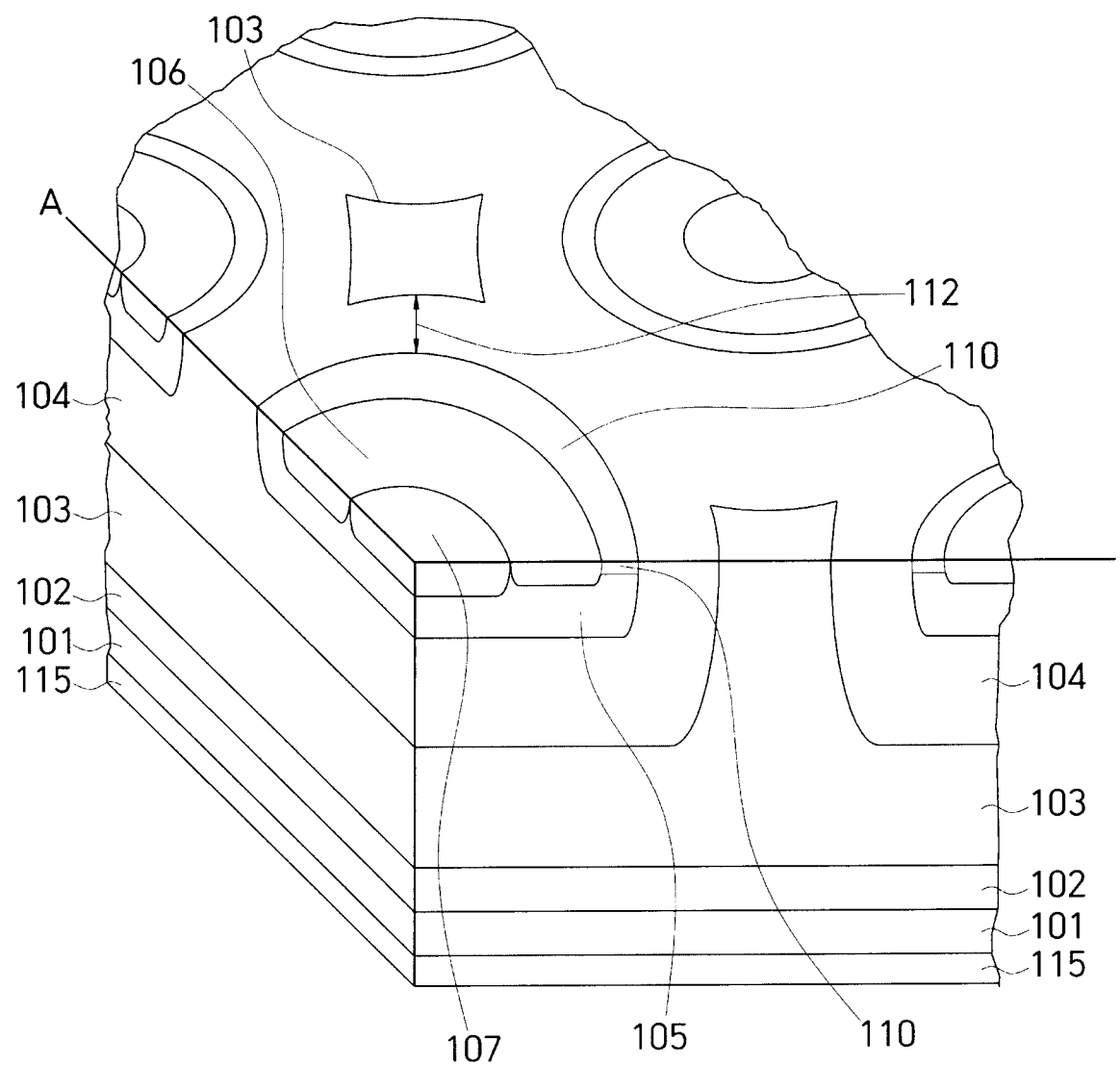
FIG. 18 is a three-dimensional cross-sectional view of an MCT device taken along line A-A' illustrated in FIG. 17, in a state where the gate electrode layer illustrated in FIG. 16 is removed.

FIG. 16 is a plan view when a gate electrode layer according to a second embodiment of the present invention is seen from above. FIG. 17 is a plan view when an MCT device is seen from above, in a state where a gate insulation layer disposed under a gate electrode layer illustrated in FIG. 16 and an interlayer insulation and an upper metal layer disposed on the gate electrode layer are removed. FIG. 18 is a three-dimensional cross-sectional view of an MCT device taken along line A-A' illustrated in FIG. 17, in a state where the gate electrode layer illustrated in FIG. 16 is removed. However, in FIG. 17, a gate electrode layer 109 is omitted.

Referring to FIGS. 16 to 18, an n-buffer layer 102 may be disposed on a p-emitter layer 101. An n-base layer 103 acting as a lower base (an n-base) of a PNPN thyristor may be disposed on the n-buffer layer 102.

A p-base region 104 may be disposed in the n-base layer 103, and an n-emitter region 105 may be disposed in the p-base region 104. In this case, an on-FET channel region 112 acting as a channel of the on-FET may be disposed under a top surface of the p-base region 104.

An n-doping region 107 and a p-drain region 106 may be disposed in the n-emitter region 105. In this case, the p-drain region 106 may act as a drain of an off-FET.

The n-doping region 107 may contact the n-emitter region 105 to enhance an ohmic contact characteristic of the n-emitter region 105 and to enhance the emitter injection efficiency of an upper NPN BJT.

A region just under a top surface of the n-emitter region 105 may be a channel region 110 of the off-FET. Simultaneously, the channel region 110 of the off-FET may act as a path through which a source current of the on-FET flows.

Ion implantation performed on the channel region 110 of the off-FET may adjust a turn-on voltage of the off-FET to enhance an off-FET characteristic. Also, the channel region 110 of the off-FET may form a PMOS channel of the depletion mode, and thus, the off-FET may be turned on based on a gate voltage of 0 V, thereby turning off the MCT device.

A gate insulation layer 108, a gate electrode layer 109, an interlayer insulation layer 113, an upper metal layer 114, and a lower metal layer 115 formed subsequently may be formed through the manufacturing process described above with reference to FIGS. 9 to 11.

The gate electrode layer 109 according to the second embodiment of the present invention, as illustrated in FIG. 16, may include a plurality of opening portions OP (OP1 to OP4) which upward expose the n-doping region 107 included in one MCT device and a portion of the p-drain region 106 surrounding the n-doping region 107.

The gate electrode layer 109 according to the second embodiment of the present invention may be arranged in a grid form or a matrix form. Each of the opening portions OP may have, for example, a circular band shape.

A unit cell region representing one MCT device on the gate electrode layer 109, as illustrated in FIG. 16, may be defined as a tetragonal region R1 including one opening portion OP1 or a tetragonal region R2 including some regions of four adjacent opening portions OP1. OP2, OP3, and OP3.

In a case where a circular opening portion is equally divided into four regions, each of some regions included in the tetragonal region R2 may be one of the four regions.

One MCT device configuring a unit cell may be arranged in a grid form or a matrix form on one wafer, and MCT devices arranged on a wafer may have the same structure.

As illustrated in FIGS. 17 and 18, when seen from above, the n+ doping region 107 and the p+ drain region 106 surrounding the n+ doping region 107, which are upward exposed by the circular opening portion OP1 formed in the gate electrode layer 109, may be formed in a line shape.

Moreover, when seen from above, the n-emitter region 105 may be formed in a line shape.

Therefore, when seen from above, a junction surface between the n-emitter region 105 and the p-base region 104 and a channel region 110 (a path through which an on-FET source current flows) of the off-FET formed between adjacent p-drain regions 106 may have a circular band shape.

Moreover, when seen from above, a surface of the n-base layer 103 acting as a lower base may have a tetragonal shape including a concave side.

The n-base layer 103 may be detached from the off-FET channel region 110 by a top surface (an on-FET channel region 112) where the p-base region 104 is exposed at a surface, and the on-FET channel region 112 may have a circular band shape having a uniform width.

The off-FET channel region 110 having a circular band shape may have the same width at all positions of the MCT device on the basis of a process of forming a channel region by using the spacer 211 as an ion implantation mask, and thus, an off-FET having a uniform characteristic may be formed.

As described above, in the MCT device including the gate electrode layer 109 including a circular opening portion arranged in a grid form, the off-FET channel region 110, and the on-FET channel region 112, the off-FET channel region 110 and the on-FET channel region 112 may be disposed at an end portion of the gate electrode layer 109 of an MCT device unit cell, and a turn-on characteristic and a turn-off characteristic of the MCT device may be uniform in all cells.

Moreover, channel ion implantation may be selectively performed on the channel region 110 of the off-FET, and thus, the off-FET may be turned on based on a low gate voltage, thereby enhancing the turn-off performance of the MCT and forming the off-FET channel region 110 through ion implantation based on p-impurities to operate in the depletion mode. Accordingly, the MCT device may be turned off based on a gate voltage of 0 V.

An MCT device, including a gate structure formed to include the circular opening portion and an on-FET and an off-FET having a circular band shape, may have an on-FET region, an off-FET region, and a PNPN thyristor area per unit cell, which are wider than an MCT device having a line-shaped gate structure, thereby enhancing a characteristic of an MCT device.

Third Embodiment

Figure 19:
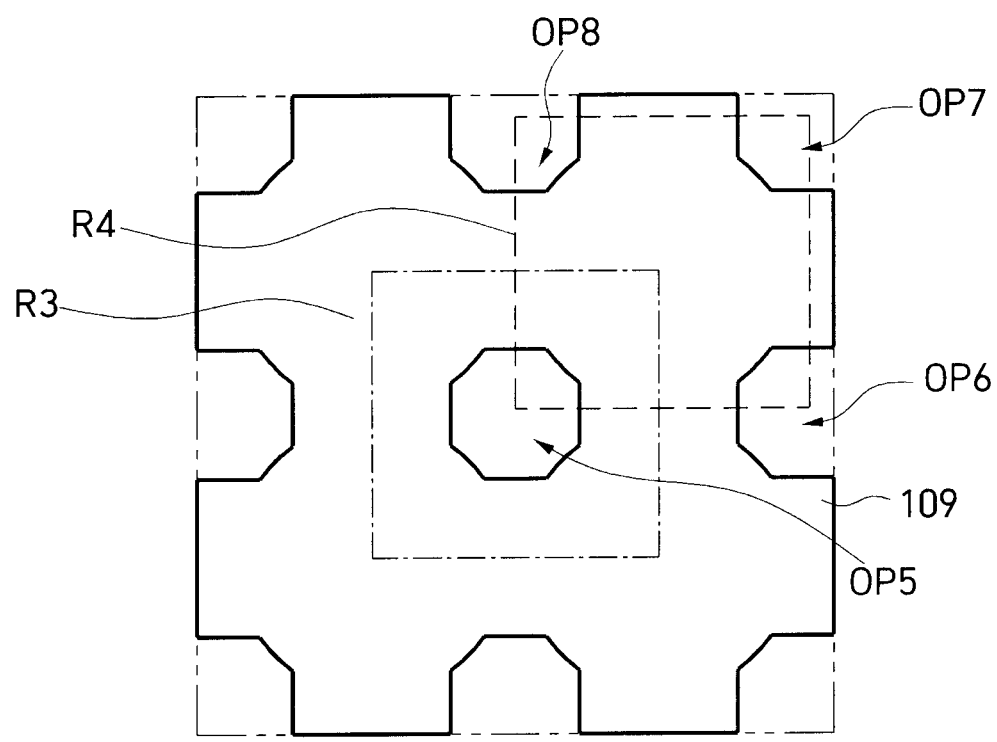
FIG. 19 is a plan view when a gate electrode layer according to a third embodiment of the present invention is seen from above.
Figure 20:
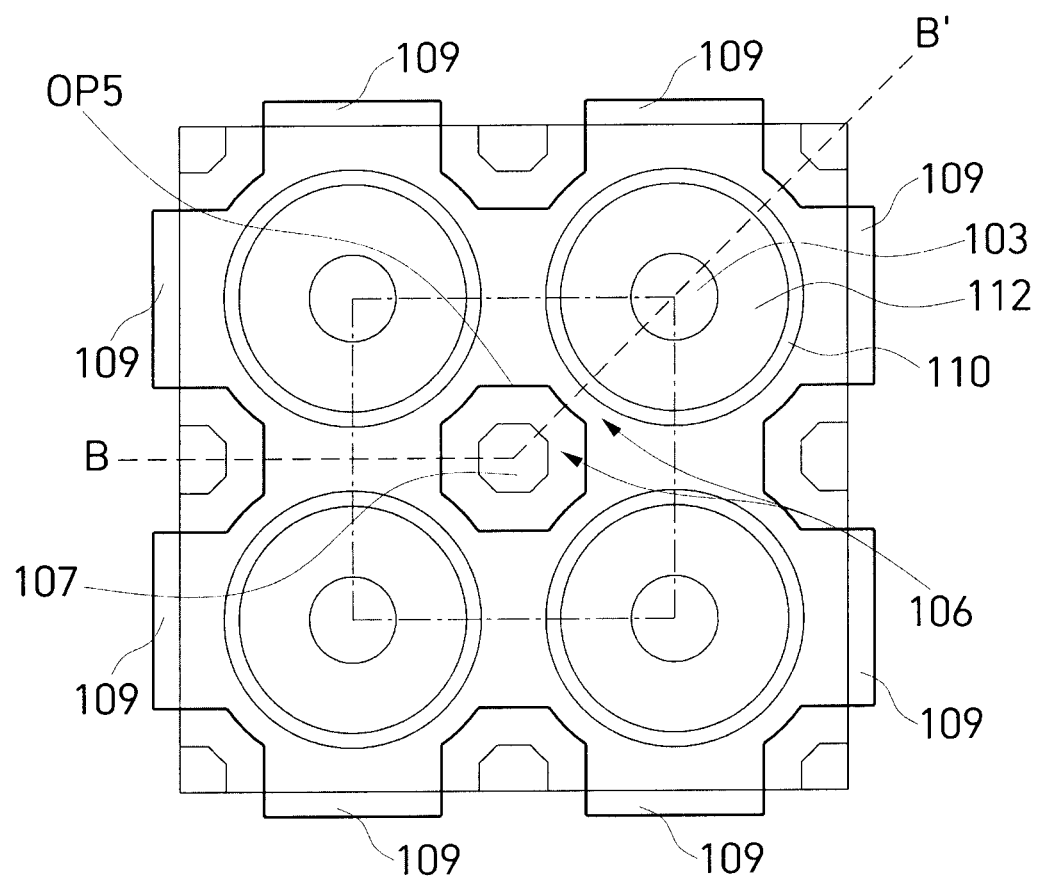
FIG. 20 is a plan view when an MCT device is seen from above, in a state where a gate insulation layer disposed under a gate electrode layer illustrated in FIG. 19 and an upper metal layer used as an interlayer insulation and a cathode disposed on the gate electrode layer are removed.
Figure 21:
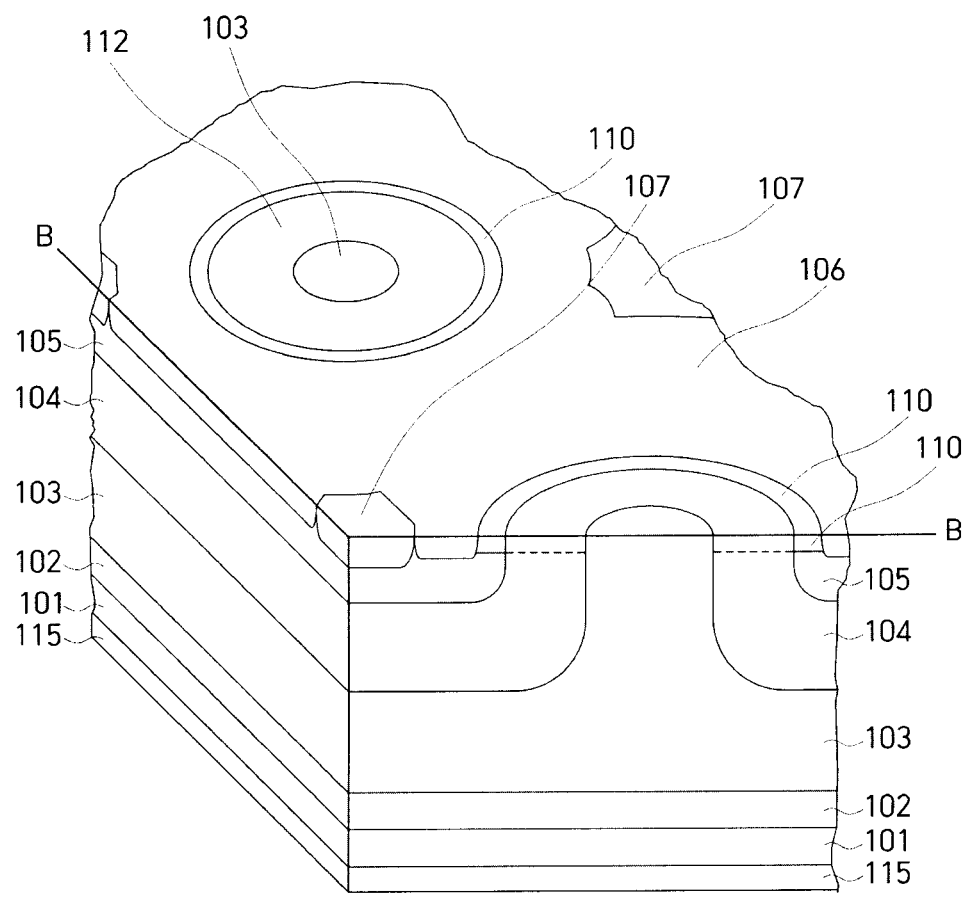
FIG. 21 is a three-dimensional cross-sectional view of an MCT device taken along line B-B' illustrated in FIG. 20.

FIG. 19 is a plan view when a gate electrode layer according to a third embodiment of the present invention is seen from above. FIG. 20 is a plan view when an MCT device is seen from above, in a state where a gate insulation layer disposed under a gate electrode layer illustrated in FIG. 19 and an upper metal layer used as an interlayer insulation and a cathode disposed on the gate electrode layer are removed. FIG. 21 is a three-dimensional cross-sectional view of an MCT device taken along line B-B' illustrated in FIG. 20. However, in FIG. 21, a gate electrode layer is omitted.

Referring to FIG. 19, a gate electrode layer 109 according to the third embodiment may include a plurality of octagonal opening portions OP5 to OP8 arranged in a grid form or a matrix form. Each of the octagonal opening portions OP5 to OP8 may include four concave sides and four rectilinear sides.

An MCT device configuring a unit cell may be defined as a tetragonal region R3 including one opening portion OP5 or a tetragonal region R4 including some of four opening portions OP5 to OP8, on the gate electrode layer 109.

Referring to FIGS. 20 and 21, in a state where a gate insulation layer 108, the gate electrode layer 109, an interlayer insulation layer 113, and an upper metal layer 114 are removed, an n-base layer 103 seen from a surface of a substrate 100 may be circular.

Moreover, in a state where the gate insulation layer 108, the gate electrode layer 109, the interlayer insulation layer 113, and the upper metal layer 114 are removed, a p-base region 104 seen from the surface of the substrate 100 may be circular.

In FIG. 20, although the p-base region 104 having a circular band shape is illustrated, when a channel region 112 of an on-FET illustrated in a circular band shape is removed, the circular p-base region 104 may be seen.

The channel region 112 of the on-FET, as illustrated in FIGS. 20 and 21, may be exposed in a circular band shape at the surface of the substrate 100 and may be disposed on the circular p-base region 104.

Although not shown in FIG. 20, an n-emitter region 105 may be formed in a region other than the n-base layer 103 seen in a circular band shape from the surface of the substrate 100 and the channel region 112 of the on-FET seen in a circular band shape from the surface of the substrate 100.

When seen from above, the p-drain region 106 and the channel region 112 of the on-FET having a circular band shape may be apart from each other with a channel region 110 of an off-FET having a circular band shape therebetween.

A circular off-FET channel region 110 seen in a circular band shape from the surface of the substrate 100, a p-drain region 106 exposed in an octagonal band shape by an octagonal opening portion OP of the gate electrode layer 109, and an n-doping region 107 surrounded by the p-drain region 106 having an octagonal band shape may be disposed on the n-emitter region 105.

The octagonal opening portion OP of the gate electrode layer 109 may include four concave sides and four rectilinear sides, and thus, the p-drain region 106 upward exposed by the opening portion OP may also include an inner side and an outer side, which include four concave sides and four rectilinear sides.

In an MCT device including a gate electrode layer including an octagonal opening portion OP including concave sides and rectilinear sides, the channel region 110 of the off-FET having a circular band shape may be formed, and simultaneously, the off-FET channel region 110 may act as a path through which a source current of the on-FET flows.

In an MCT device according to the third embodiment, the channel region 110 of the off-FET and the channel region 112 of the on-FET may have a circular band shape and may be formed to have the same structure at all positions, and thus, an off-FET and an on-FET having a uniform characteristic may be implemented.

Moreover, channel ion implantation may be selectively performed on the channel region 110 of the off-FET, and thus, the off-FET may be turned on based on a low gate voltage, thereby enhancing the turn-off performance of the MCT. Also, a p-layer channel operating in the depletion mode may be formed, and thus, the MCT device may be turned off based on a gate voltage of 0 V.

An MCT device, including a gate structure having the octagonal opening portion and the off-FET and on-FET channel regions 110 and 112, may have an on-FET region, an off-FET region, and a PNPN thyristor area per unit cell, which are wider than an MCT device having a line-shaped gate structure, thereby enhancing a characteristic of an MCT device.

Fourth Embodiment

Figure 22:
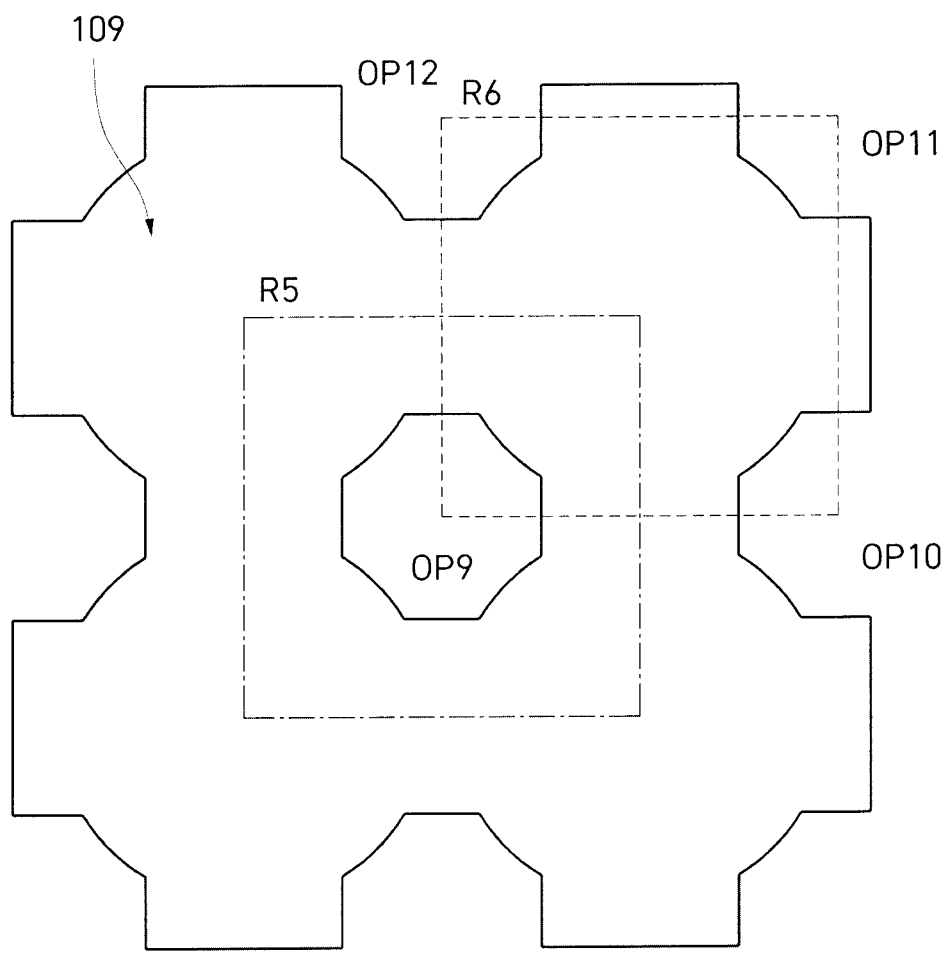
FIG. 22 is a plan view when a gate electrode layer according to a fourth embodiment of the present invention is seen from above.
Figure 23:
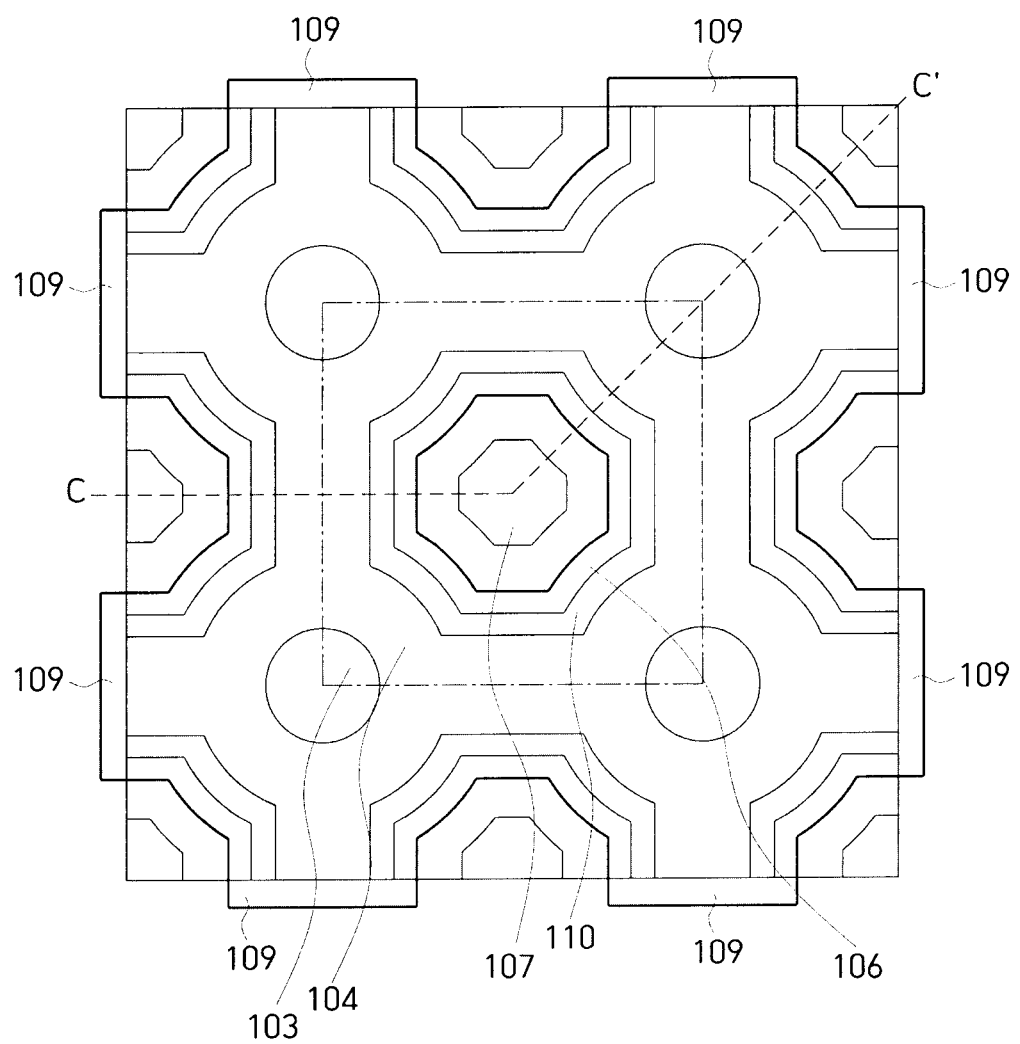
FIG. 23 is a plan view when an MCT device is seen from above, in a state where a gate insulation layer disposed under a gate electrode layer illustrated in FIG. 22 and an upper metal layer used as an interlayer insulation and a cathode disposed on the gate electrode layer are removed.
Figure 24:
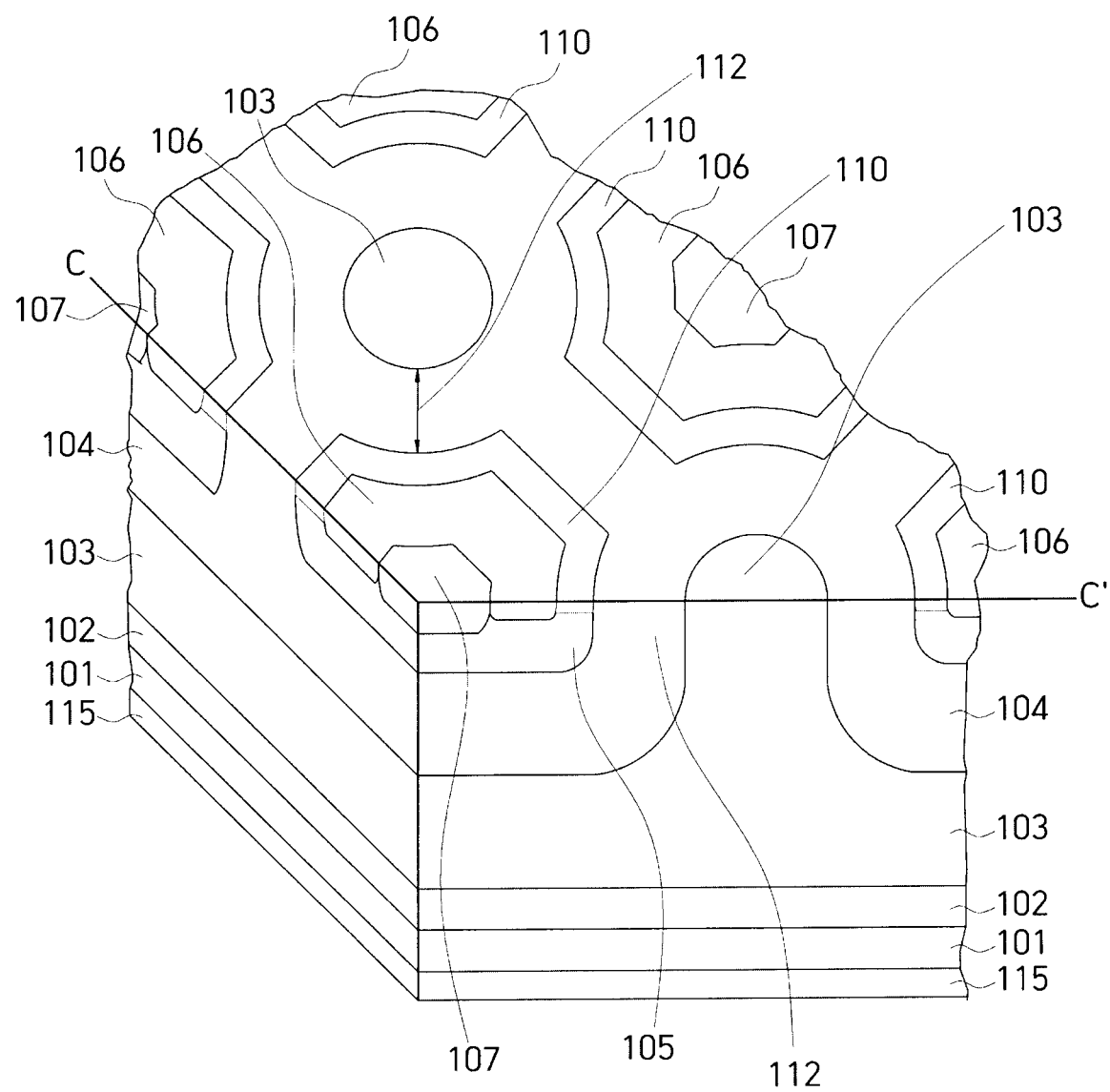
FIG. 24 is a three-dimensional cross-sectional view of an MCT device taken along line C-C' illustrated in FIG. 23.

FIG. 22 is a plan view when a gate electrode layer according to a fourth embodiment of the present invention is seen from above. FIG. 23 is a plan view when an MCT device is seen from above, in a state where a gate insulation layer disposed under a gate electrode layer illustrated in FIG. 22 and an upper metal layer used as an interlayer insulation and a cathode disposed on the gate electrode layer are removed. FIG. 24 is a three-dimensional cross-sectional view of an MCT device taken along line C-C' illustrated in FIG. 23. However, in FIG. 24, a gate electrode layer 109 is omitted.

Referring to FIGS. 22 to 24, a gate electrode layer 109 according to the fourth embodiment may include a plurality of octagonal opening portions OP9 to OP12 arranged in a grid form or a matrix form as illustrated in FIG. 22. Each of the octagonal opening portions OP9 to OP12 may include four concave sides and four rectilinear sides.

An MCT device configuring a unit cell may be defined as a tetragonal region R5 including one opening portion OP9 or a tetragonal region R6 including some of four opening portions OP9 to OP12, on the gate electrode layer 109.

An n-doping region 107, a p-drain region 106 surrounding the n-doping region 107, and an off-FET channel region 110 may be disposed in an n-emitter region 105.

The octagonal opening portion OP of the gate electrode layer 109 according to the fourth embodiment may upward expose the n-doping region 107 included in one MCT device and a portion of the p-drain region 106 surrounding the n-doping region 107.

When seen from above, the n-doping region 107 upward exposed by the octagonal opening portion OP of the gate electrode layer 109 may have an octagonal shape including four concave sides and four rectilinear sides.

When seen from above, the p-drain region 106 where a portion thereof is upward exposed by the octagonal opening portion OP of the gate electrode layer 109 may have an octagonal band shape to surround the octagonal n-doping region 107.

Therefore, when seen from above, the p-drain region 106 having an octagonal band shape may include eight inner sides and eight outer sides. The eight inner sides may include four concave sides and four rectilinear sides, and the eight outer sides may include four concave sides and four rectilinear sides.

When seen from above, the off-FET channel region 110 surrounding the p-drain region 106 having an octagonal band shape may have an octagonal band shape having a certain width.

Therefore, the off-FET channel region 110 may include eight inner sides and eight outer sides. The eight inner sides may include four concave sides and four rectilinear sides, and the eight outer sides may include four concave sides and four rectilinear sides.

In a state where a gate insulation layer 108, the gate electrode layer 109, an interlayer insulation layer 113, and an upper metal layer 114 are removed, as illustrated in FIGS. 23 and 24, an n-base layer 103 seen from a surface of a substrate 100 may be circular.

In a state where the gate insulation layer 108, the gate electrode layer 109, the interlayer insulation layer 113, and the upper metal layer 114 are removed, as illustrated in FIG. 24, the n-base layer 103 seen from the surface of the substrate 100 may be apart from the channel region 110 of the off-FET having an octagonal band shape by a certain interval with the p-base region 104, seen from the surface of the substrate 100, therebetween.

In an MCT device including the gate electrode layer 109 including an octagonal opening portion, an off-FET channel region 110 having an octagonal band shape may be formed, and each of an inner side and an outer side of the off-FET channel region 110 having an octagonal band may include four sides and four sides.

According to a process of manufacturing the MCT device described above, the off-FET channel region 110 may be formed to have a short width and a uniform channel length, and thus, an off-FET having a uniform characteristic may be implemented.

Moreover, channel ion implantation may be selectively performed on the channel region 110 of the off-FET, and thus, the off-FET may be turned on based on a low gate voltage, thereby enhancing the turn-off performance of the MCT.

Moreover, a p-layer channel operating in the depletion mode may be formed, and thus, the MCT device may be turned off based on a gate voltage of 0 V.

An MCT device, including the gate electrode layer 109 having the octagonal opening portion OP and the off-FET channel region 110 having an octagonal band shape, may have an on-FET region, an off-FET region, and a PNPN thyristor area per unit cell, which are wider than an MCT device having a line-shaped gate electrode layer, thereby enhancing a characteristic of an MCT device.

In a process of manufacturing the MCT device according to the embodiments of the present invention, an off-FET channel having a uniform and short length may be formed by using a self-align process of a method of forming and recessing a spacer, and thus, the current driving capability of an off-FET and the uniformity of a device operation may be enhanced.

Moreover, in the embodiments of the present invention, channel ion implantation may be selectively performed on a channel region of an off-FET, and thus, the turn-off performance of the MCT may be enhanced by turning on the off-FET on the basis of a low gate voltage. Also, an off-FET channel of the depletion mode may be formed, and thus, the MCT device may be turned off based on a gate voltage of 0 V.

Moreover, in the embodiments of the present invention, an off-FET and an on-FET may be disposed in all unit cells of the MCT device, and when seen from a plane, a channel length of the off-FET may be uniformly designed, thereby implementing an MCT device having uniform performance in a self-align process.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a metal oxide semiconductor (MOS)-controlled thyristor (MCT) device, the method comprising:

forming a first conductive type base region doped with first conductive type impurities and a second conductive type emitter region doped with second conductive type impurities in the first conductive type base region, in a substrate;

forming a spacer on a side surface of an oxide layer which is formed on the substrate and upward exposes the second conductive type emitter region;

ion-implanting the first conductive type impurities into the second conductive type emitter region upward exposed by the spacer to form a first conductive type drain region of an off-field effect transistor (TFT) and to form a channel region of the off-FET defined between a junction surface of the second conductive type emitter region and a junction surface of the first conductive type drain region;

ion-implanting the first conductive type impurities into the upward exposed channel region of the off-FET by removing the spacer;

removing the oxide layer and forming a gate electrode layer, upward exposing the first conductive type drain region and the second conductive type emitter region, on the substrate;

ion-implanting the second conductive type impurities into the second conductive type emitter region upward exposed by the gate electrode layer to form a second conductive type doping region; and forming an upper metal layer, used as a cathode electrode, on the gate electrode layer, the first conductive type drain region, and the second conductive type doping region and a lower metal layer, used as an anode electrode, on a bottom surface of the substrate.

2. The method of claim 1, wherein the forming of the channel region of the off-FET comprises performing an ion implantation process of ion-implanting the first conductive type impurities into the second conductive type emitter region upward exposed by the spacer and a photoresist pattern formed on the second conductive type emitter region upward exposed by the spacer by using the spacer and the photoresist pattern as an ion implantation mask.

3. The method of claim 1, wherein the channel region of the off-FET is formed in a lateral direction between the junction surface of the second conductive type emitter region and the junction surface of the first conductive type drain region, under the spacer.

4. The method of claim 1, wherein the ion-implanting of the first conductive type impurities into the channel region of the off-FET comprises:

removing the spacer by using an isotropic etching process; and ion-implanting the first conductive type impurities into the channel region of the off-FET upward exposed by the isotropic etching process to adjust a turn-on voltage of the off-FET.

5. The method of claim 4, wherein the first conductive type impurities ion-implanted into the channel region of the off-FET are first conductive type impurities, and an ion dose of the first conductive type impurities is about $1 \times 10^{11}$ cm$^{-2}$ or about $1 \times 10^{13}$ cm$^{-2}$.

6. The method of claim 1, wherein the ion-implanting of the first conductive type impurities into the channel region of the off-FET comprises:

further removing the spacer and the oxide layer by using an etching process;

forming another oxide layer on a surface of the substrate upward exposed by removing the spacer and the oxide layer;

forming another photoresist pattern on the other oxide layer and between the first conductive type base region and another first conductive type base region adjacent to the first conductive type base region; and performing an ion implantation process of ion-implanting the first conductive type impurities into the channel region of the off-FET and a channel region of an on-FET adjacent to the channel region of the off-FET by using the other photoresist pattern as an ion implantation mask.

7. The method of claim 6, wherein the channel region of the off-FET is a region under a surface of the first conductive type base region.

8. The method of claim 1, wherein the ion-implanting of the first conductive type impurities into the channel region of the off-FET comprises:

further removing the oxide layer and the spacer by using an etching process;

forming another oxide layer on a whole surface of the substrate upward exposed by removing the oxide layer and the spacer; and ion-implanting the first conductive type impurities into the channel region of the off-FET and a channel region of an on-FET adjacent to the channel region of the off-FET to form a threshold voltage adjustment layer on the whole surface of the substrate.

9. The method of claim 1, wherein, when the first conductive type impurities are p-type impurities, the second conductive type impurities are n-type impurities, and when the first conductive type impurities are n-type impurities, the second conductive type impurities are p-type impurities.

* * * * *